(12) United States Patent
Kim

(10) Patent No.: US 9,124,261 B2
(45) Date of Patent: Sep. 1, 2015

(54) FLIP-FLOP CIRCUIT

(75) Inventor: Minsu Kim, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/291,349

(22) Filed: Nov. 8, 2011

(65) Prior Publication Data

US 2012/0139601 A1 Jun. 7, 2012

(30) Foreign Application Priority Data

Dec. 2, 2010 (KR) .................... 10-2010-0122286

(51) Int. Cl.
H03K 3/00 (2006.01)
H03K 3/356 (2006.01)

(52) U.S. Cl.
CPC ................ H03K 3/356173 (2013.01)

(58) Field of Classification Search
CPC .............................. H03K 3/356173
USPC .................. 327/218, 215, 199, 219
See application file for complete search history.

(56) References Cited

U.S. PATENT DOCUMENTS

| | | | | |
|---|---|---|---|---|
| 5,825,224 A * | 10/1998 | Klass et al. | .......... | 327/200 |
| 6,278,308 B1 * | 8/2001 | Partovi et al. | .......... | 327/218 |
| 6,853,228 B2 | 2/2005 | Hirata et al. | | |
| 7,301,373 B1 * | 11/2007 | Bailey et al. | .......... | 327/55 |
| 7,514,976 B2 | 4/2009 | Kim | | |
| 7,639,057 B1 | 12/2009 | Su | | |
| 7,710,155 B2 * | 5/2010 | Bhatia et al. | .......... | 326/93 |
| 7,772,891 B1 * | 8/2010 | Yang et al. | .......... | 326/95 |
| 7,994,836 B2 * | 8/2011 | Hart et al. | .......... | 327/208 |
| 8,164,363 B1 * | 4/2012 | Su | .......... | 327/51 |
| 2002/0075053 A1 * | 6/2002 | Ganesan | .......... | 327/218 |
| 2010/0301915 A1 * | 12/2010 | Hart et al. | .......... | 327/218 |

FOREIGN PATENT DOCUMENTS

| | | |
|---|---|---|
| JP | 2004-159315 | 6/2004 |
| JP | 2004-214717 | 7/2004 |
| KR | 10-2007-0087371 | 8/2007 |

OTHER PUBLICATIONS

Klass et al., "A New Family of Semidynamic and Dynamic Flip-Flops with Embedded Logic for High-Performance Processors," IEEE Journal of Solid-State Circuits, vol. 34, No. 5, May 1999, pp. 712-716.

* cited by examiner

Primary Examiner — Jung Kim
(74) Attorney, Agent, or Firm — Ellsworth IP Group PLLC

(57) ABSTRACT

A flip-flop circuit includes an evaluation part connected to a first node and a second node to discharge the second node according to a voltage level of the first node, a conditional delay part connected to the second node to discharge a third node to have a voltage level different from a voltage level of the second node, and a keeper logic part connected to the second node and third node to maintain a voltage level of one of the second and third nodes being not discharged.

18 Claims, 23 Drawing Sheets

FLIP-FLOP CIRCUIT

CROSS-REFERENCE TO RELATED APPLICATIONS

This application claims priority, under 35 U.S.C. §119, of Korean Patent Application No. 10-2010-0122286 filed Dec. 2, 2010, the entirety of which is incorporated by reference herein.

BACKGROUND OF THE INVENTION

1. Field of the Invention

Exemplary embodiments relate to a semiconductor integrated circuit, and more particularly, relate to a flip-flop circuit.

2. Description of the Related Art

Digital logic systems are classified into combinational circuits and sequential circuits. Combinational circuits are formed of logic gates, outputs of which are decided by current inputs. Combinational circuits perform an information processing operation which is logically characterized by the Boolean expressions.

Sequential circuits use storage elements called a flip-flop together with logic gates. Outputs of storage elements are a function of their inputs and states. States of storage elements are a function of previous inputs thereof. As a result, outputs of sequential circuits are based on current inputs and previous inputs, and operations of sequential circuits are decided by internal states and a time sequence of inputs.

Accordingly, high-speed flip-flops are required to design high-speed chips. Flip-flops with a conventional master-slave structure are not suitable for designing high-speed chips.

SUMMARY OF THE INVENTION

The present general inventive concept provides a semiconductor circuit to perform a high-speed operation, and a flip flop having the same.

Additional aspects and advantages of the present general inventive concept will be set forth in part in the description which follows and, in part, will be obvious from the description, or may be learned by practice of the general inventive concept The foregoing and/or other aspects and utilities of the present general inventive concept may be achieved by providing a flip-flop circuit which may include an evaluation part connected to a first node and a second node and discharging the second node according to a voltage level of the first node, a conditional delay part connected to the second node and discharging a third node to have a voltage level different from a voltage level of the second node, and a keeper logic part connected to the second node and third node and maintaining a voltage level of one of the second and third nodes being not discharged.

The evaluation part may include a first transistor forming a current path between the second node and a ground voltage according to a voltage level of the first node, and the conditional delay part may include a second transistor forming a current path between the third node and the ground voltage according to a voltage level of the second node. If the second node is discharged when the first transistor is turned on, the second transistor is turned off and a discharge path of the third node is interrupted.

The keeper logic part may include a third transistor forming a current path between a power supply voltage and the third node according to a voltage level of the second node. If the second node is discharged, the third transistor is turned on to be charged with the power supply voltage.

The keeper logic part may further include a fourth transistor forming a current path between the second node and a ground voltage according to a voltage level of the second node. If the second node is discharged, the fourth transistor may be turned on to maintain a discharge state of the second node.

If the second node is discharged, a voltage level of the first node may be maintained until a discharge operation of the second node is completed.

The evaluation part may include a first transistor and a second transistor connected in series each other, the first and second transistors forming a discharge path on the second node in response to a clock signal and a voltage level of the first node, respectively.

The evaluation part may further include a third transistor which is connected to the second transistor and form a discharge path on the second node according to a voltage level of the third node.

The evaluation part may further include a fourth transistor which is connected between a power supply voltage and the first transistor and forms a charge path on the second node according to a clock signal.

The conditional delay part may include a first transistor and a second transistor connected in series each other, the first and second transistors forming a discharge path on the third node according to a voltage of the second node and a voltage of the first node, respectively.

The conditional delay part may further include a third transistor which is connected to the second transistor and form a discharge path on the third node in response to a clock signal.

The conditional delay part may further include a fourth transistor which is connected between a power supply voltage and the first transistor and forms a path for charging the third node with the power supply voltage.

The keeper logic part may include a transistor which is connected to the second node and form a current path between the second node and a ground voltage according to a voltage level of the second node.

The keeper logic part may include a first transistor connected to the second node and forming a current path between the second node and a ground voltage according to a voltage level of the second node, and a second transistor connected to the second node and forming a current path between the second node and a power supply voltage according to a voltage level of the third node.

The keeper logic part may further include a third transistor which is connected to the third node and form a current path between the third node and a ground voltage according to a voltage level of the third node.

The keeper logic part may further include a fourth transistor which is connected to the third node and form a current path between the third node and a power supply voltage according to a voltage level of the second node.

The evaluation part and the conditional delay part may receive a clock signal, respectively and may be triggered at a rising edge of the clock signal to discharge one of the second node and the third node, and the keeper logic part may maintain a voltage level of one being not discharged of the second and third nodes at a logic high interval of the clock signal.

The flip-flop circuit may further include a latch part which maintains voltage levels of the second and third nodes, determined at a logic high interval of the clock signal, during a logic low interval of the clock.

The flip-flop circuit may further include an inverter connected to the second node and configured to invert a logic level of the second node.

The foregoing and/or other aspects and utilities of the present general inventive concept may also be achieved by providing a flip-flop circuit including an evaluation part connected to an input node and an output node to perform an evaluation operation in which a logic level of an output signal output via the output node is changed or maintained according to a logic level of an input signal provided via the input node, a conditional delay part connected to the output node and a feedback node to change or maintain a logic level of a feedback signal output via the feedback node to have a logic level different from a logic level of the output signal, and a keeper logic part connected to the feedback node and the output node to maintain a logic level of the output signal after the evaluation operation.

The evaluation part may be triggered according to an edge of a clock signal to perform the evaluation operation, and the keeper logic part may maintain a logic level of the output signal during half a cycle of the clock signal after the evaluation operation.

The flip-flop circuit may further include a latch part connected to the output node, and the latch part may maintain a logic level of the output signal during a cycle of the clock signal after the evaluation operation.

The flip-flop circuit may further include a combinational logic part connected to the output node, and the combinational logic part may include an inverter inverting a logic level of the output signal after the evaluation operation.

The evaluation part may include at least two transistors configured to have a stack form.

The conditional delay part may include at least two transistors configured to have a stack form, and a size of each of the at least two transistors included in the conditional delay part may be larger than that of the at least two transistors included in the evaluation part.

The evaluation part may include a first transistor connected to the output node to form a current path in response to a logic level of the input signal, and a second transistor connected in parallel with the first transistor to form a current path in response to a scan enable signal.

The keeper logic part may include a first transistor connected between the output node and a ground voltage to form a current path in response to a logic level of the output node, and a second transistor connected between the feedback node and a power supply voltage to form a current path in response to a logic level of the feedback signal, wherein when the output signal and the feedback signal have a logic low level and a logic high level, respectively, the first and second transistors may be turned on to prevent the output and feedback signals from being floated.

The keeper logic part may further include a third transistor connected between the output node and the power supply voltage to form a current path in response to a logic level of the feedback node, and a fourth transistor connected between the feedback node and the ground voltage to form a current path in response to a logic level of the feedback node, wherein when the output signal and the feedback signal have a logic high level and a logic low level, respectively, the third and fourth transistors may be turned on to prevent the output and feedback signals from being floated.

The foregoing and/or other aspects and utilities of the present general inventive concept may also be achieved by providing a flip-flop circuit including an evaluation part having a first potential and a first discharge path, to receive two signals, and to output a first output signal according to the potential and the first discharge path which are selected by the two signals, a conditional delay part having a second potential and a second discharge path, to receive the two signals, and to generate a second output according to the second potential and the second discharge path, which are determined by the first output and the two signals, and a keeper logic part to maintain levels of the first output signal and the second output signal during a transition of at least one of the two signals according to a combination of the two signal, the first output, and the second output.

The first discharge path may be formed with a plurality of first transistors to have a first characteristic, and the second discharge path may be formed with a plurality of second transistors to have a second characteristic different from the first characteristic such that a first discharge speed of the first discharge path is faster than a second discharge speed of the second discharge path.

The first discharge path may be formed with a plurality of transistors to have a first channel width and a first channel length, and the second discharge path may be formed with a plurality of second transistors to have a second channel width and a second channel length, such that a sampling window becomes narrow and a power consumption is reduced.

The second discharge path may discharge the first output signal according to a change of the second output signal and may discharge the second output signal according to a change of the first output signal.

The foregoing and/or other aspects and utilities of the present general inventive concept may also be achieved by providing a flip-flop circuit including an evaluation part to receive a clock signal and one or more input signals and to output a first output signal according to levels of the clock signal and the input signals, a conditional delay part to receive the clock signal and the input signals and to output a second output signal to control the evaluation part and the first output signal, and a keeper logic part to maintain at least one of the first output signal of the evaluation part and the second output signal of the conditional delay part during a transition of at least one of the clock signal and the one or more input signals.

The evaluation part may include a potential and a discharge path formed with transistors connected to receive the clock signal, at least one input signals, and the voltage level, respectively, and may selectively output the first output signal according to a selection of the potential and the discharge path.

The conditional delay part may include a plurality of discharge paths to selectively discharge the first output signal and the second output signal according to a combination of the first output signal, the second output signal, the clock signal, and the one or more input signals.

The conditional delay part may include at least one common transistor connected to the plurality of discharge paths.

The keeper logic part may include a plurality of potentials to control and maintain the first output signal and the second output signal according to states of the second output signal and the first signal, respectively.

The evaluation part may include a plurality of first transistors to form a first discharge path having a first discharge time to provide the first output signal, the conditional delay part may include a plurality of second transistors to form a second discharge path having a second discharge time to control the first output signal and the second output signal; and the first discharge time may be shorter than the second discharge time.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
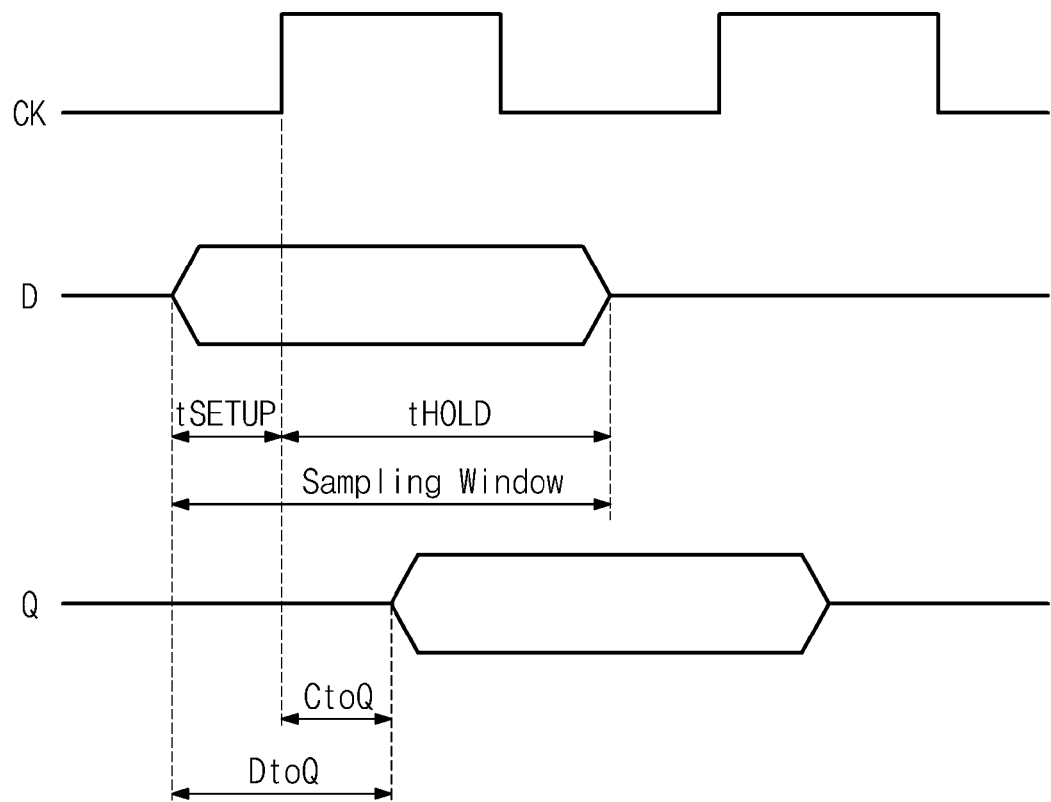
FIG. 1 is a diagram showing parameters for evaluating the performance of a flip-flip according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram illustrating parameters for evaluating the performance of a flip-flip according to an exemplary embodiment of the present general inventive concept. For ease of description, it is assumed that a flip-flop is triggered in response to a rising edge of a signal, for example, a clock signal or pulse. In FIG. 1, 'D' and 'Q' indicate an input signal and an output signal of a flip-flop, respectively. Since a logic level of an input signal D includes valid information (that is, data), it is referred to as "data".

A speed of the flip-flop is generally decided by an input-to-output time DtoQ. The input-to-output time DtoQ is defined by a sum of a setup time tSETUP and a clock-to-output time CtoQ. As well known, the setup time tSETUP is a time needed to stably provide data, that is, the input signal D provided to the flip-flop. The clock-to-output time CtoQ indicates a delay time from a rising edge of a clock signal CK to a time when output data Q is issued.

Accordingly, designing of a high-speed flip-flop necessitates reduction of the input-to-output time DtoQ. By shortening the input-to-output time DtoQ, a flip-flop according to an exemplary embodiment of the inventive concept operates in a higher speed than a conventional master-slave type flip-flop.

A sampling window indicates a time when data of the input signal D is maintained to stably store it in the flip-flop. The sampling window is defined by a sum of the setup time tSETUP and a hold time tHOLD. The hold time tHOLD means a time from a rising edge of the clock signal CK to a point of time when data of the input signal D is maintained.

As the sampling window becomes narrow, a time needed for maintaining data of the input signal D is shortened. This means a decrease in the number of components (for example, a buffer) necessary for maintaining data of the input signal D in case of a sequential circuit including flip-flops. Accordingly, reduction of the sampling window makes it possible to reduce an area for implementing a sequential circuit including flip-flops and to reduce a power consumed thereby.

Below, there will be described a flip-flop according to an exemplary embodiment of the inventive concept which has a sampling window being more narrow than that of a conventional flip-flop (for example, a master-slave type flip-flop or a pulse-based flip-flop).

Figure 2:
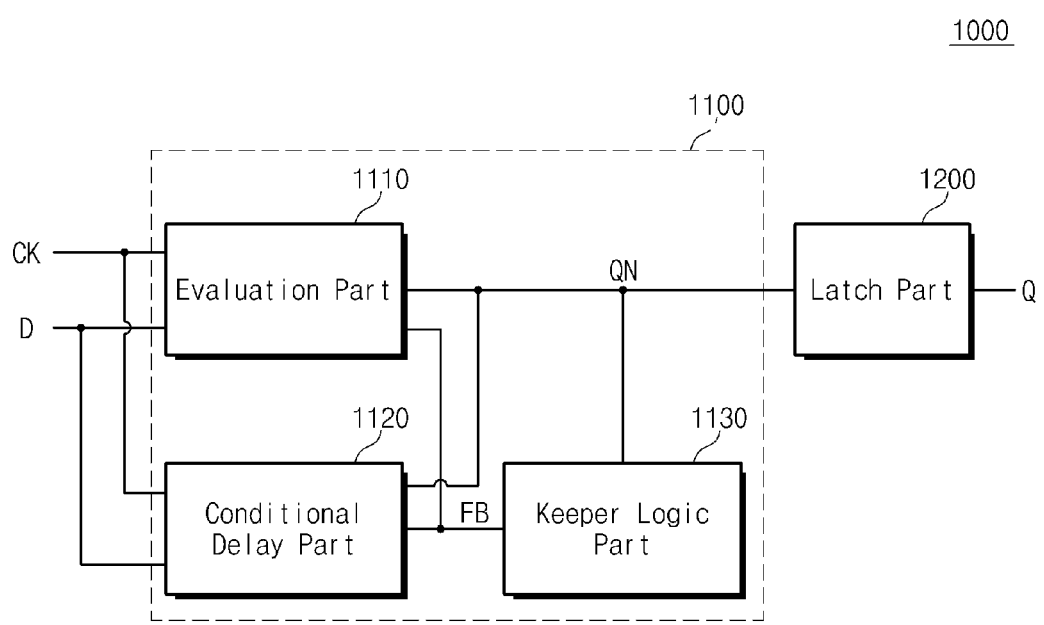
FIG. 2 is a block diagram illustrating a flip-flip according to an exemplary embodiment of the present general inventive concept.

FIG. 2 is a block diagram illustrating a flip-flip 1000 according to an exemplary embodiment of the present general inventive concept. As illustrated in FIG. 2, a flip-flop 1000 includes a flop circuit 1100 and a latch part 1200.

The flop circuit 1100 receives a clock signal CK and an input signal D to output a signal QN. The flop circuit 1100 stores data of the input signal D, determined at a rising edge of the clock signal, during a logic high interval of the clock signal CK. The flop circuit 1100 includes an evaluation part 1110, a conditional delay part 1120, and a keeper logic part 1130.

The evaluation part 1110 receives the clock signal CK and the input signal D. The evaluation part 1110 discharges the signal QN to output a first state of the signal QN or cuts off a discharge path of the signal QN to output a second state of the signal QN according to data of the input signal D determined at a rising edge of the clock signal CK. An operation of the evaluation part 1110 is referred to as an evaluation operation. For rapid execution of a main operation of the flop circuit 1100 as an evaluation operation, the evaluation part 1110 may be formed of transistors each having a wider channel width and a shorter channel length as compared with the conditional delay part 1120.

The conditional delay part 1120 receives the clock signal CK and the input signal D. The conditional delay part 1120 receives the signal QN via a feedback loop. During a logic high interval of the clock signal CK, the conditional delay part 1120 discharges a signal FB or cuts off a discharge path of the signal FB, based on data of the signals D and QN.

At a logic high interval of the clock signal CK, the signals FB and QN are discharged to have different logic levels from each other. That is, if the signal QN has a logic high level, the conditional delay part 1120 discharges the signal FB such that the signal FB goes to a logic low level. If the signal QN is at a logic low level, the conditional delay part 1120 cuts off a discharge path of the signal FB such that the signal FB maintains a logic high level. To reduce the power consumed by the conditional delay part 1120, transistors of the conditional delay part 1120 are formed to have a small size (e.g., transistors each having a narrower channel width) as compared with transistors of the evaluation part 1110.

The keeper logic part 1130 receives the signals QN and FB. When the signal QN or FB is discharged, the keeper logic part 1130 maintains a signal FB or QN, being not discharged, 0 to have a logic high level. For example, when the signal QN is discharged, the keeper logic part 1130 charges the signal FB with a power supply voltage Vdd such that the signal FB maintains a logic high level. On the other hand, if the signal FB is discharged, the keeper logic part 1130 charges the signal QN with a power supply voltage Vdd such that the signal QN maintains a logic high level.

The keeper logic part 1130 maintains a logic level of the signal QN or FB regardless of a variation of the input signal D. For example, the signals QN and FB may have a logic high level and a logic low level by the evaluation part 1110 and the conditional delay part 1120, respectively. And then, when a logic level of the input signal D transitions, the keeper logic part 1130 maintains the signals QN and FB with a logic high level and a logic low level regardless of a transition of the input signal D.

The flop circuit 1100 stores data of the input signal D, determined at a rising edge of the clock signal CK, during a logic high interval of the clock signal CK (i.e., half a cycle).

The evaluation part 1110 evaluates the signal QN, determined at a rising edge of the clock signal CK, according to data of the input signal D. The conditional delay part 1120 discharges the signal FB having a logic level different from that of the signal QN. The keeper logic part 1130 maintains a logic level of the signal QN during a logic high interval of the clock signal CK using the signals QN and FB having different logic levels. Accordingly, data of the input signal D determined at a rising edge of the clock signal CK is switched into a logic level of the signal QN, and a logic level of the signal QN is maintained for a logic high interval of the clock signal CK.

If the clock signal CK is at a logic low level, the flop circuit 1100 resets the signals QN and FB to a logic high level. As illustrated in FIG. 2, the flip-flop 1000 includes a latch part 1200 to maintain the signals QN and FB even during a logic low interval of the clock signal CK.

When the latch part 1200 receives the signal QN from the flop circuit 1100, the latch part 1200 issues an output signal Q. During a logic low interval of the clock signal CK, the latch part 1200 retains a logic level of the signal QN which is determined at a logic low interval of the clock signal CK. That is, the flop circuit 1100 may perform a general flip-flop operation together with the latch part 1200.

Figure 3:
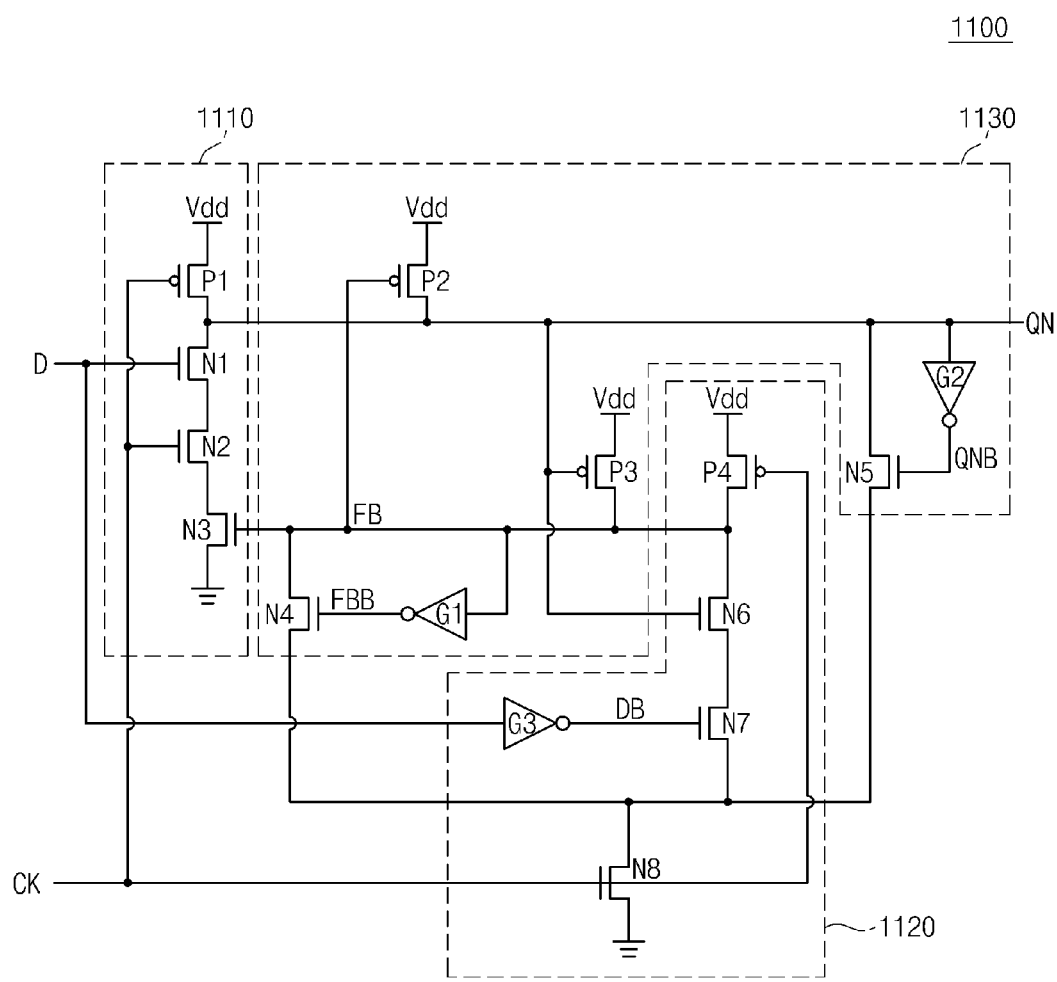
FIG. 3 is a circuit diagram illustrating a flop circuit of FIG. 2 according to an exemplary embodiment of the present general inventive concept.

FIG. 3 is a circuit diagram illustrating the flop circuit 1100 of FIG. 2 according to an exemplary embodiment of the present general inventive concept.

Referring to FIGS. 2 and 3, an evaluation part 1110 includes a PMOS transistor P1. The PMOS transistor P1 operates responsive to a clock signal CK, and resets a signal QN to a logic high level during a logic low interval of the clock signal CK.

The evaluation part 1110 further includes at least three NMOS transistors N1, N2, and N3 being stacked in series. The NMOS transistors N1, N2 and N3 operate responsive to an input signal D, the clock signal CK, and a signal FB, respectively. The NMOS transistors N1, N2 and N3 evaluate a signal QN according to data of the input signal D. The structure of the NMOS transistors N1, N2, and N3 may be modified variously, which will be more fully described later with reference to FIGS. 9, 10, and 11.

A conditional delay part 1120 includes a PMOS transistor P4. The PMOS transistor P4 operates responsive to the clock signal CK. The PMOS transistor P4 resets the signal FB to a logic high level during a logic low interval of the clock signal CK.

The conditional delay part 1120 further includes three NMOS transistors N6 to N8 which are connected in series. The NMOS transistors N6, N7, and N8 are configured to discharge the signal FB in response to the signal QN, an inverted version of the input signal D (hereinafter, referred to as DB), and the clock signal CK. Since a gate of the NMOS transistor N6 is connected with the signal QN, the signal FB is discharged to a logic low level when the signal QN has a logic high level. That is, the signal FB and QN have different logic levels during a logic high interval of the clock signal CK.

A keeper logic part 1130 includes two PMOS transistors P2 and P3 which operate responsive to the signals FB and QN, respectively. The PMOS transistors P2 and P3 maintain a signal, being not discharged, with a logic high level when any one of the signals FB and QN is discharged. For example, when the signal QN is discharged, the PMOS transistor P3 is turned on in response to the signal QN. This enables the signal FB to be charged to a logic high level.

The keeper logic part 1130 further includes two NMOS transistors N4 and N5 which are connected to the signals FB and QN via inverters G1 and G2, respectively, and which operate in response to an inverted version of the signal FB (hereinafter, referred to as FBB) and an inverted version of the signal QN (hereinafter, referred to as QNB), respectively. During a logic high interval of the clock signal CK, the NMOS transistors N4 and N5 retain the signals FB and QN with a logic low level regardless of a variation of data of the input signal D.

With the embodiment of the flop circuit 1100 illustrated in FIG. 3, the evaluation part 1110 of the flop circuit 1100 is formed of three stacked NMOS transistors N1, N2, and N3. This stack structure enables data of the input signal D to be reflected to the signal QN within a shorter time than a master-slave structure.

For a fast evaluation operation, the NMOS transistors N1, N2, and N3 may be designed to have a wide channel width and a short channel length. Accordingly, a flip-flop 1000 (refer to FIG. 2) utilizing the flop circuit 1100 in FIG. 3 may perform an evaluation operation within a shorter time as compared with a flip-flop of a conventional master-slave structure. As a result, an input-to-output time DtoQ of the flip-flop 1000 (refer to FIG. 2) using the flop circuit 1100 in FIG. 3 may be shortened as compared with that of a conventional master-slave structure flip flop.

Further, in the event that the conditional delay part 1120 of the flop circuit 1100 discharges the signal FB, a time taken to discharge the signal FB may be determined substantially by one transistor N8 as described in the flop circuit 1100 of FIG. 3. Accordingly, a data keeping time on the input signal D required to discharge the signal FB may be also determined by the transistor N8.

Since the data keeping time of the input signal D is determined only by one transistor, a sampling window of the flip-flop 1000 using the flop circuit 1100 in FIG. 3 may become narrow as compared with a master-slave type flip-flop or a pulse-based flip-flop. This will be more fully described with reference to FIGS. 5 through 8.

Figure 4:
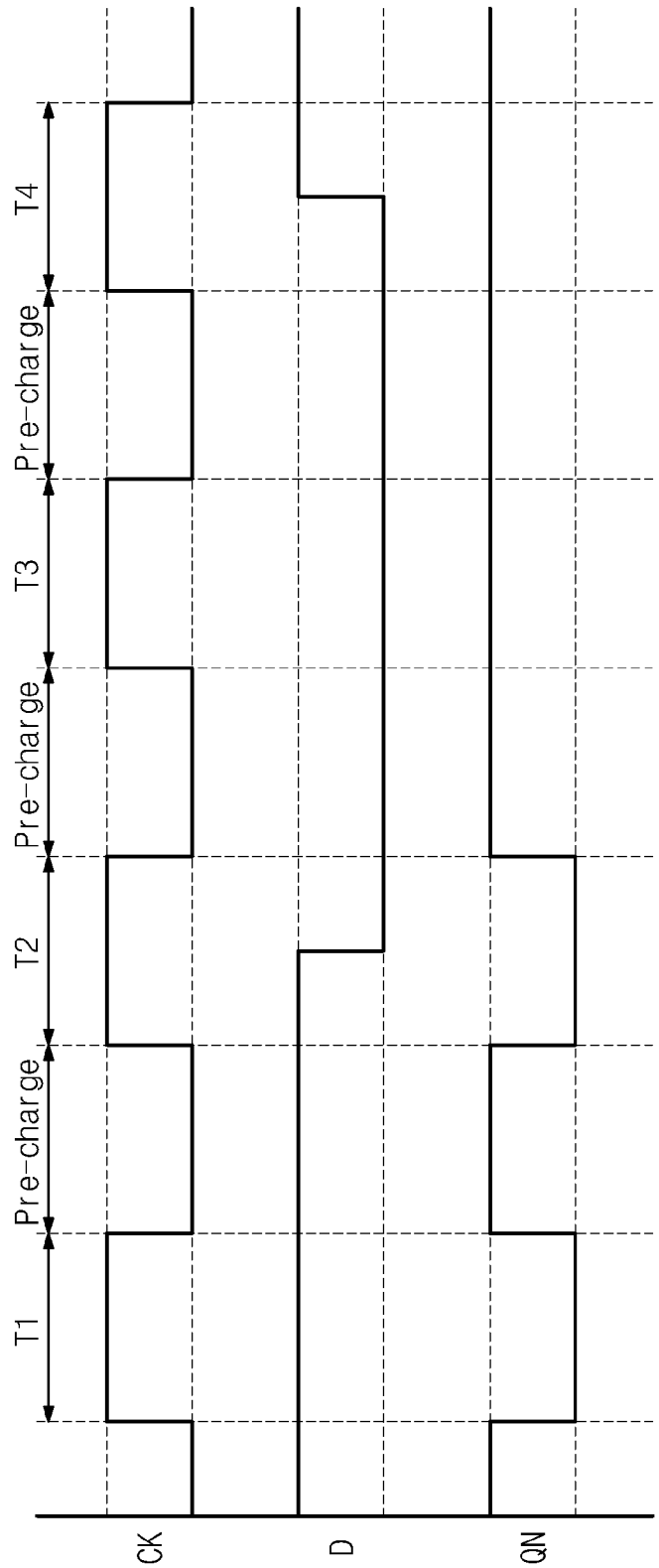
FIG. 4 is a timing diagram illustrating an operation of a flop circuit illustrated in FIG. 3.

FIG. 4 is a timing diagram illustrating an operation of a flop circuit of FIG. 3.

Referring to intervals T1 and T2, when data of an input signal D has a logic high level at a rising edge of a clock signal CK, a logic low level of a signal QN is retained by a flop circuit 1100 regardless of a variation of the input signal D. Further, referring to intervals T3 and T4, when data of the input signal D has a logic low level at a rising edge of a clock signal CK, the logic high level of the signal QN is maintained by the flop circuit 1100 regardless of a variation of the input signal D.

That is, the flop circuit 1100 evaluates the signal QN according to data of the input signal D corresponding to a rising edge of the clock signal CK and maintains the evaluated value of the signal QN within a logic high interval of the clock signal CK. During a logic low interval of the clock signal CK, the flop circuit 1100 resets the signal QN to a logic high level.

Below, an operation of the flop circuit 1100 of FIG. 3 with respect to intervals T1 to T4 will be more fully described with reference to FIGS. 5 to 8.

Figure 5:
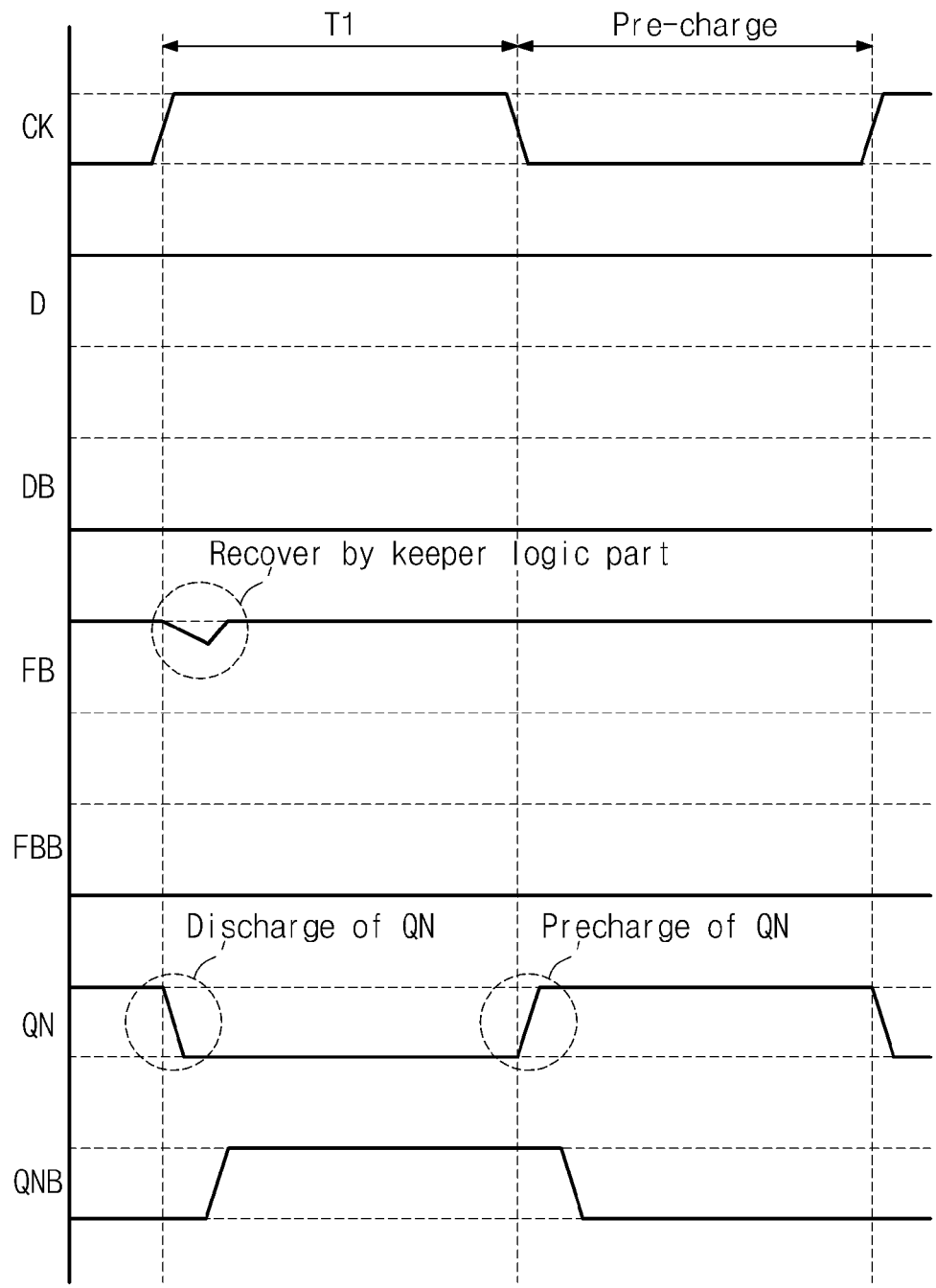
FIG. 5 is a timing diagram illustrating an operation of a flop circuit within an interval T1 illustrated in FIG. 4.

FIG. 5 is a diagram illustrating an operation of a flop circuit 1100 with respect to an interval T1 illustrated in FIG. 4. As illustrated in FIGS. 4 and 5, data of an input signal D has a logic high level at the interval T1. Blow, an operation of a flop circuit 1100 at the interval T1 will be more fully described with reference to FIGS. 3 to 5.

Before the interval T1, a clock signal CK has a logic low level. Accordingly, a PMOS transistor P1 of an evaluation part 1110 is turned on, an NMOS transistor N2 is turned off. This means that a signal QN is charged with a logic high level according to a potential Vdd. Further, since a PMOS transistor P4 of a conditional delay part 1120 is turned on and an NMOS transistor N8 thereof is turned off, a signal FB is charged with a logic high level according to a potential Vdd.

At the interval T1, the clock signal CK transitions from a logic low level to a logic high level. Since the clock signal CK transitions to a logic high level, an NMOS transistor N2 is turned on. Since the signal FB has a logic high level at the interval T1, an NMOS transistor N3 is turned on. Thus, if the clock signal CK transitions from a logic low level to a logic high level, the NMOS transistors N2 and N3 of the evaluation part 1110 are turned on. Here, since an NMOS transistor N1 is turned on according to a logic high level of the input signal D, a discharge path of the signal QN is formed by the turned-on NMOS transistors N1, N2, and N3. This means that the signal QN is discharged according to a discharge operation thereof.

In this case, since a signal DB has a logic low level according to a logic high level of the input signal D, an NMOS transistor N7 of the conditional delay part 1120 is turned off. Thus, a discharge path of the signal FB is cut off, and the signal FB may be floated for a moment. But, a PMOS transistor P3 of a keeper logic part 1130 is turned on according to the discharge operation of the signal QN. Accordingly, the signal FB is recovered or maintained to a logic high level.

That is, in the event that data of the input signal D maintains a logic high level, the evaluation part 1110 discharges the signal QN to a logic low level, the conditional delay part 1120 interrupts a discharge path of the signal FB and turns on the PMOS transistor P3, and the keeper logic part 1130 maintains a logic high level of the signal FB.

During a pre-charge interval, the clock signal CK transitions from a logic high level to a logic low level. In this case, the PMOS transistor P1 of the evaluation part 1110 and the PMOS transistor P4 of the conditional delay part 1120 are turned on. Thus the signals QN and FB are charged to a logic high level according to a potential Vdd.

Here, an NMOS transistor N5 is turned on according to a logic low level of the signal QN, and an NOMOS transistor N8 is turned on according to a logic high level of the clock signal CK. Thus, the turned on NMOS transistors N5 and N8 may form another discharge path of the signal QN at the interval T1.

At the interval T1, a discharge speed of the signal QN may determine the speed of the flop circuit 1100. That is, the higher a discharge speed of the signal QN, the shorter an input-to-output time DtoQ of the flop circuit 1100. Accordingly, to realize the flop circuit 1100 operating at a high speed, NMOS transistors of the evaluation part 1110 may be designed to have a large size (e.g., a wide channel width and a short channel length).

Figure 6:
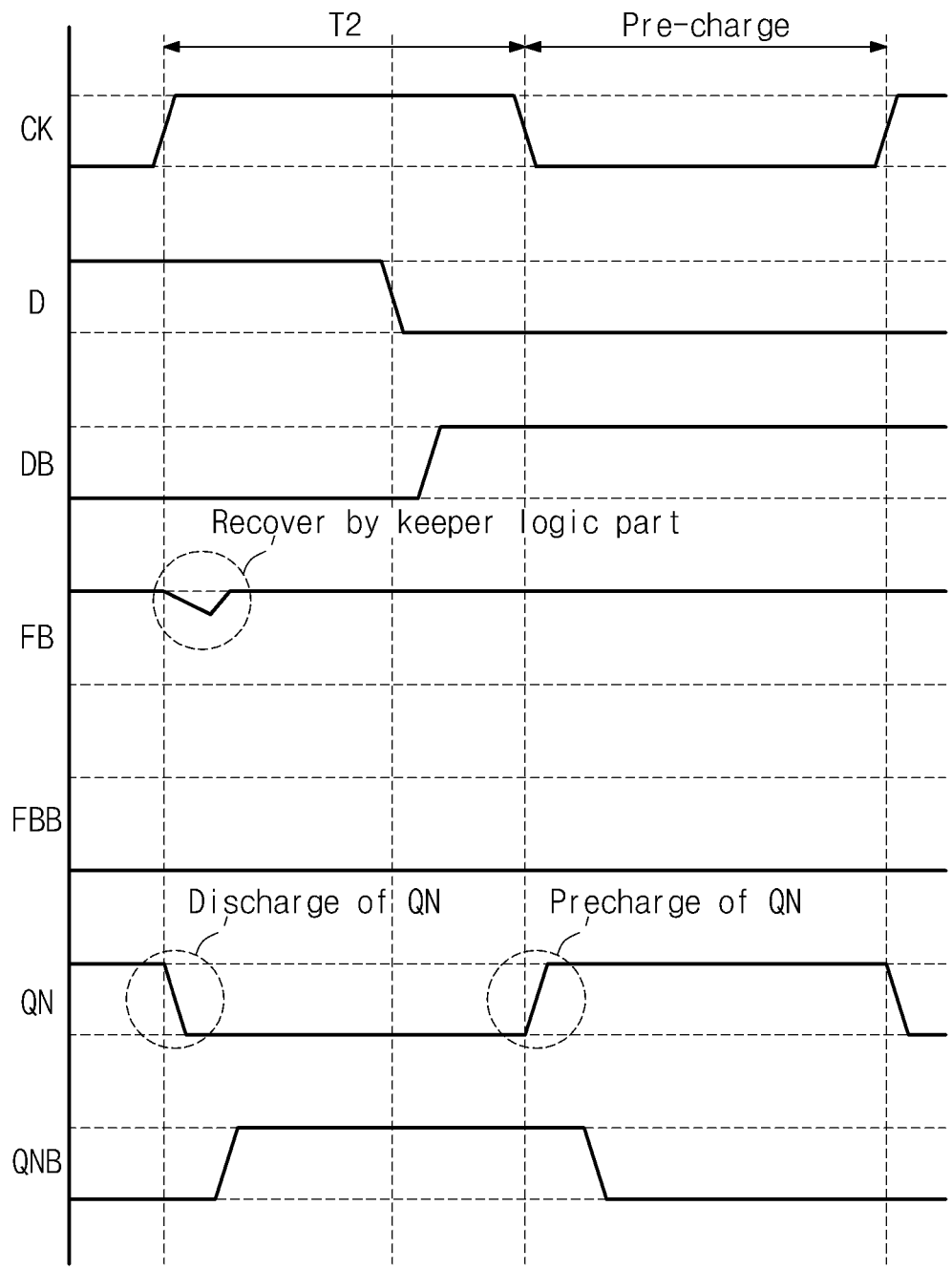
FIG. 6 is a timing diagram illustrating an operation of a flop circuit within an interval T2 illustrated in FIG. 4.

FIG. 6 is a timing diagram illustrating an operation of a flop circuit 1100 with respect to an interval T2 illustrated in FIG. 4. Referring to FIGS. 4 and 6, data of an input signal D transitions from a logic high level to a logic low level. Below, an operation of a flop circuit 1100 at an interval P2 will be more fully described with reference to FIGS. 3 and 6.

The clock signal CK may have a logic low level before the interval T2. In this case, the signals QN and FB have a logic high level. This is identical to that of FIG. 5, and description thereof is thus omitted.

At the interval T2, the clock signal CK transitions from a logic low level to a logic high level. In this case, the signal QN is discharged, and the signal FB maintains a logic high level. This is identical to that described in FIG. 5, and description thereof is thus omitted.

When a discharge operation of the signal QN is completed, the input signal D transitions from a logic high level to a logic low level. In this case, an NMOS transistor N1 of an evaluation part 1110 is turned off, so that a discharge path of the evaluation part 1110 is cut off. But, since a signal QNB has a logic high level due to a discharge of the signal QN, an NMOS transistor N5 of a keeper logic part 1130 is turned on. Since n NMOS transistor N8 of a conditional delay part 1120 continues to maintain a turn-on state according to a logic high interval of the clock signal CK, the signal QN is discharged via the discharge path formed with the NMOS transistors N5 and N8, so that a logic low level of the signal QN can be maintained. In this case, since the signal QN has a logic low level, a PMOS transistor P3 of the keeper logic part 1130 is turned on, and the signal FB maintains a logic high level. Accordingly, although data of the input signal D transitions from a logic high level to a logic low level at the interval T2, the signals QN and FB maintain a logic low level and a logic high level, respectively.

As a result, although data of the input signal D transitions from a logic high level to a logic low level, the signals QN and FB maintain a logic low level and a logic high level by the keeper logic part 1130, respectively. An operation of a pre-charge interval is similar to that described in FIG. 5, and description thereof is thus omitted.

Figure 7:
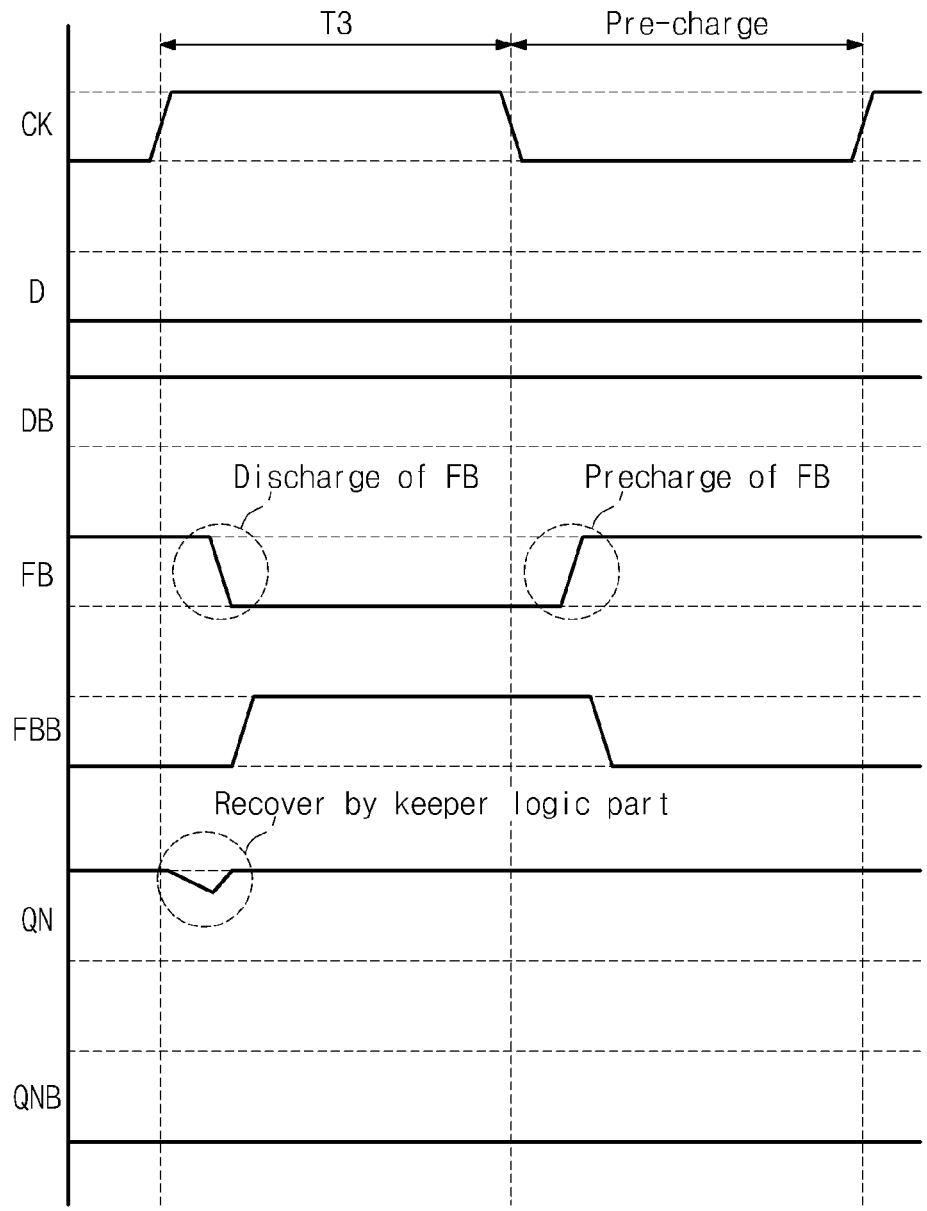
FIG. 7 is a timing diagram illustrating an operation of a flop circuit within an interval T3 illustrated in FIG. 4.

FIG. 7 is a timing diagram illustrating an operation of a flop circuit 1100 with respect to an interval T3 illustrated in FIG. 4. As illustrated in FIGS. 4 and 7, data of an input signal D maintains a logic low level at an interval T3. Below, an operation of a flop circuit 1100 being with respect to the interval T3 will be more fully described with reference to FIGS. 3 and 7.

A clock signal CK has a logic low level before the interval T3. In this case, signals QN and FB have a logic high level. This is identical to that described in FIG. 5, and description thereof is thus omitted.

At the interval T3, the clock signal CK transitions from a logic low level to a logic high level. Since the clock signal CK transitions to a logic high level, an NMOS transistor N8 of a conditional delay part 1120 is turned on. Further, since signals DB and QN have a logic high level at a transition timing of the clock signal CK, NMOS transistors N6 and N7 of the conditional delay part 1120 maintain a turn-on state. As a result, the NMOS transistors N6 and N7 of the conditional delay part 1120 are all turned on, and the signal FB is discharged through a discharge path of the NMOS transistors N6, N7, and N8 of the conditional delay path 1120.

In the event that the clock signal CK transitions from a logic low level to a logic high level, a PMOS transistor P1 of an evaluation part 1110 is turned off, and an NMOS transistor N2 is turned on. Accordingly, the signal QN may be floated for a time. But, as the signal FB is discharged, the PMOS transistor P2 of the keeper logic part 1130 is turned on. Thus, the signal QN is recovered (or maintained) to a logic high level.

That is, in a case where data of the input signal D maintains a logic low level, the evaluation part 1110 interrupts a discharge path of the signal QN, the conditional delay part 1120 discharges the signal FB, and the keeper logic part 1130 maintains the signal QN at a logic high level.

A discharge speed of the signal FB may not affect a speed of a flop circuit 1100. That is, an input-to-output time DtoQ of the flop circuit 1100 may be determined by a discharge speed of the signal QN illustrated in FIGS. 5 and 6, and a discharge speed of the signal FB may not greatly affect an input-to-output time DtoQ of the flop circuit 1100. In this case, to reduce power consumption of transistors, NMOS transistors N6, N7, and N8 of the conditional delay part 1120 may be designed to have a small size (e.g., a narrow channel width), compared to the NMOS transistors N1, N2, and N3 of the evaluation part 1110.

Referring to FIGS. 5, 6, and 7, since the NMOS transistors N6, N7, and N8 of the conditional delay part 1120 are formed to have a small size, a discharge operation of the signal FB may be conducted after a delay time, compared to a discharge operation of the signal QN.

Figure 8:
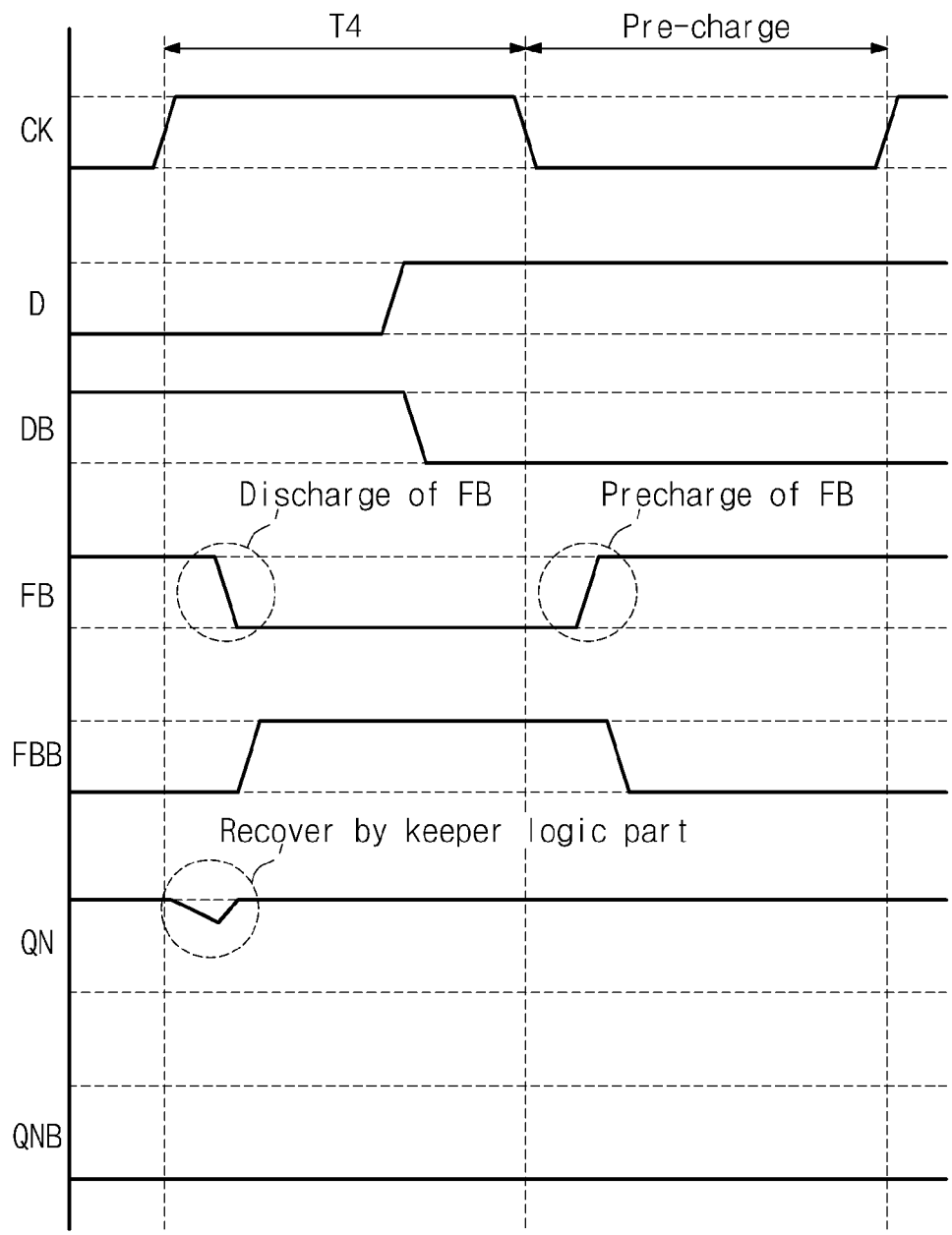
FIG. 8 is a timing diagram illustrating an operation of a flop circuit within an interval T4 illustrated in FIG. 4.

FIG. 8 is a timing diagram illustrating an operation of a flop circuit 1100 with respect to an interval T4 illustrated in FIG. 4. As illustrated in FIGS. 4 and 8, data of an input signal D transitions from a logic low level to a logic high level within an interval T4. Below, an operation of a flop circuit 1100 at the interval T4 will be more fully described with reference to FIGS. 3 and 8.

A clock signal CK has a logic low level before the interval T4. In this case, signals QN and FB have a logic high level, respectively. This is identical to that described in FIG. 5, and description thereof is thus omitted.

At the interval T4, the clock signals CK transitions from a logic low level to a logic high level. In this case, a signal FB is discharged according to a discharge path of the NMOS transistors N6, N7, and N8 of the conditional delay path 1120, and a signal QN maintains a logic high level according to a potential Vdd. This is similar to that described in FIG. 7, and description thereof is thus omitted.

When a discharge operation of the signal FB is completed, data of an input signal D transitions from a logic low level to a logic high level. In this case, an NMOS transistor N7 of a conditional delay part 1120 is turned off, so that a discharge path of the conditional delay part 1120 is interrupted. But, since a signal FBB has a logic high level due to a discharge of the signal FB, an NMOS transistor N4 of a keeper logic part 1130 is turned on. Since an NMOS transistor N8 is continuously turned on for a logic high interval of the clock signal CK, the signal FB is connected with a ground voltage via the NMOS transistors N4 and N8. As a result, the signal FB maintains a logic low level.

When the signal FB has a logic low level, a PMOS transistor P2 of the keeper logic part 1130 is turned on and the signal QN maintains a logic high level. Accordingly, although data of an input signal D transitions from a logic low level to a logic high level within the interval T4, the signals FB and QN maintain a logic low level and a logic high level, respectively.

As a result, although data of an input signal D transitions from a logic low level to a logic high level, the signals FB and QN maintain a logic low level and a logic high level by the keeper logic part 1130, respectively.

A flip-flop 1000 of FIG. 2 has a sampling window which is narrower than that of a conventional flip-flop (e.g., a master-slave type flip-flop). This may be accomplished by shortening a time taken to maintain a logic level of the input signal D in the flop circuit 1100.

Referring to FIG. 8, a discharge operation of the signal FB may end before a variation of the input signal D in order to retain a logic low level of the signal FB regardless of a data variation of the input signal D. In other words, the input signal D need maintain a logic high level to a minimum until a discharge operation of the signal FB is completed. A sampling window represents a minimum time required to retain a logic level of the input signal D. Accordingly, a time taken to complete a discharge operation of the signal FB may determine a sampling window of the flop circuit 1100.

The signal FB is connected to a potential, such as a ground voltage, via NMOS transistors N6, N7, and N8 of a conditional delay part 1120. Since the NMOS transistors N6, N7, and N8 are turned on at a rising edge of a clock signal CK, a discharge time of the signal FB may be determined by a NMOS transistor N8. This means that a sampling window of the flop circuit 1100 is delayed by the NMOS transistor N8. It is possible that a sampling window of the flop circuit 1100 is delayed only by a single NMOS transistor N8.

On the other hand, a sampling window of a conventional master-slave type flip-flop or pulse-based flip-flop may be widened due to a plurality of transistors as is well known in the art. As a result, the flop circuit 1100 and a flip-flop 1000 (refer to FIG. 2) including the same may have a sampling window narrower than that of a conventional flip-flop.

Meanwhile, referring to FIG. 6, a discharge operation of a signal QN may need to be completed before a variation of an input signal D in order to maintain a logic low level of the signal QN regardless of a variation of data of the input signal D. That is, a time taken to complete a discharge operation of the signal QN may determine a sampling window of the flop circuit 1100. But, for rapid execution of an evaluating operation, NMOS transistors N1, N2, and N3 of an evaluation part 1110 may be formed to have a relatively large size, compared to the NMOS transistors N6, N7, and N8 of the evaluation part 1110. In this case, a discharge time of the signal QN becomes shorter than that of the signal FB, so that the sampling window of the flop circuit 1100 may be determined by a discharge time of the signal FB.

As described above, the flop circuit 1100 according to an exemplary embodiment of the inventive concept may store data of an input signal D, determined at a rising edge of a clock signal CK, during a logic high interval of the clock CK.

For this, the flop circuit 1100 may include an evaluation part 1110, a conditional delay part 1120, and a keeper logic part 1130. The flop circuit 1100 operates in a high speed and has a sampling window narrower than a conventional flip-flop.

The flop circuit 1100 may be modified and changed variously. For example, a stack structure of the evaluation part 1110 in the flop circuit 1100 may be modified variously. Further, it is possible to merge transistors in the flop circuit 1100 in order to form it within a small area. Below, various examples of the flop circuits will be more fully described with reference to FIGS. 9 to 14.

Figure 9:
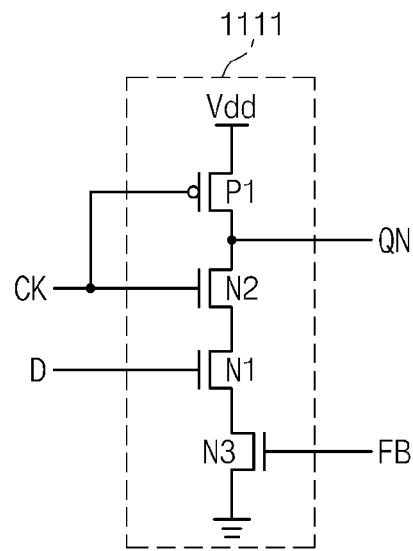
FIGS. 9, 10, and 11 are diagrams illustrating an evaluation part of a flop circuit illustrated in FIG. 3 according to exemplary embodiments of the inventive concept.
Figure 10:
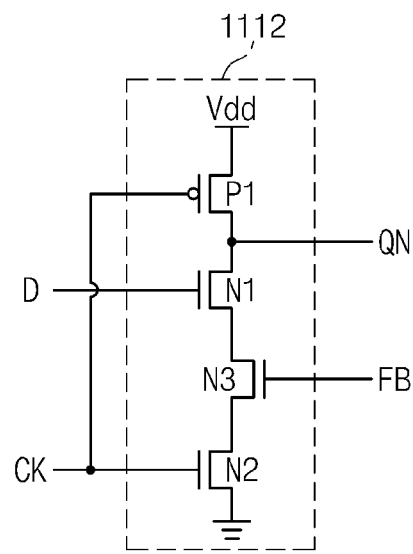
Figure 11:
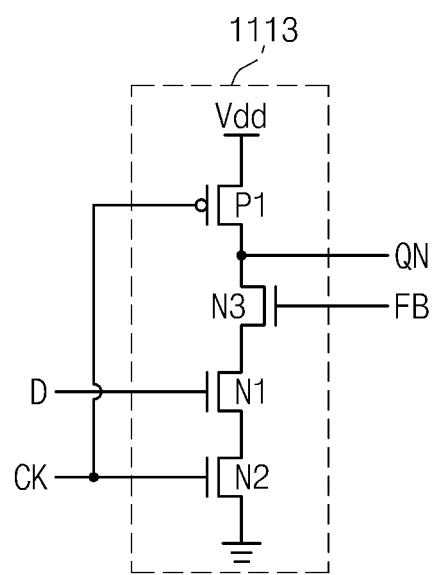

FIGS. 9, 10, and 11 are diagrams illustrating an evaluation part 1111 as an evaluation part of a flop circuit of FIG. 3 according to an exemplary embodiments of the inventive concept. For the sake of description, in FIGS. 3 and 9 to 11, transistors having the same gate inputs are represented by the same reference numerals.

As illustrated in FIGS. 9, 10, and 11, a stack structure of an evaluation part 1110 in FIG. 3 may be changed variously. For example, referring to FIG. 9, the stack structure of the evaluation part 1111 may be configured such that locations of NMOS transistors N1 and N2 of an evaluation part 1110 in FIG. 3 are changed. Referring to FIG. 10, the stack structure of an evaluation part 1112 may be configured such that locations of NMOS transistors N2 and N3 of the evaluation part 1110 in FIG. 3 are changed. Further, referring to FIG. 11, the stack structure of an evaluation part 1113 may be configured such that locations of NMOS transistors N1 and N3 of the evaluation part 1110 in FIG. 3 are changed. Although the stack structure is changed, an evaluation operation of the evaluation parts 1111 to 1113 in FIGS. 9 to 11 are performed in the same manner as that in FIG. 3. Accordingly, a conditional delay part 1120 and a keeper logic part 1130 in FIG. 3 are connected with each of the evaluation parts 1111 to 1113 in FIGS. 9 to 11 to perform the same operation, and description thereof is thus omitted.

Figure 12:
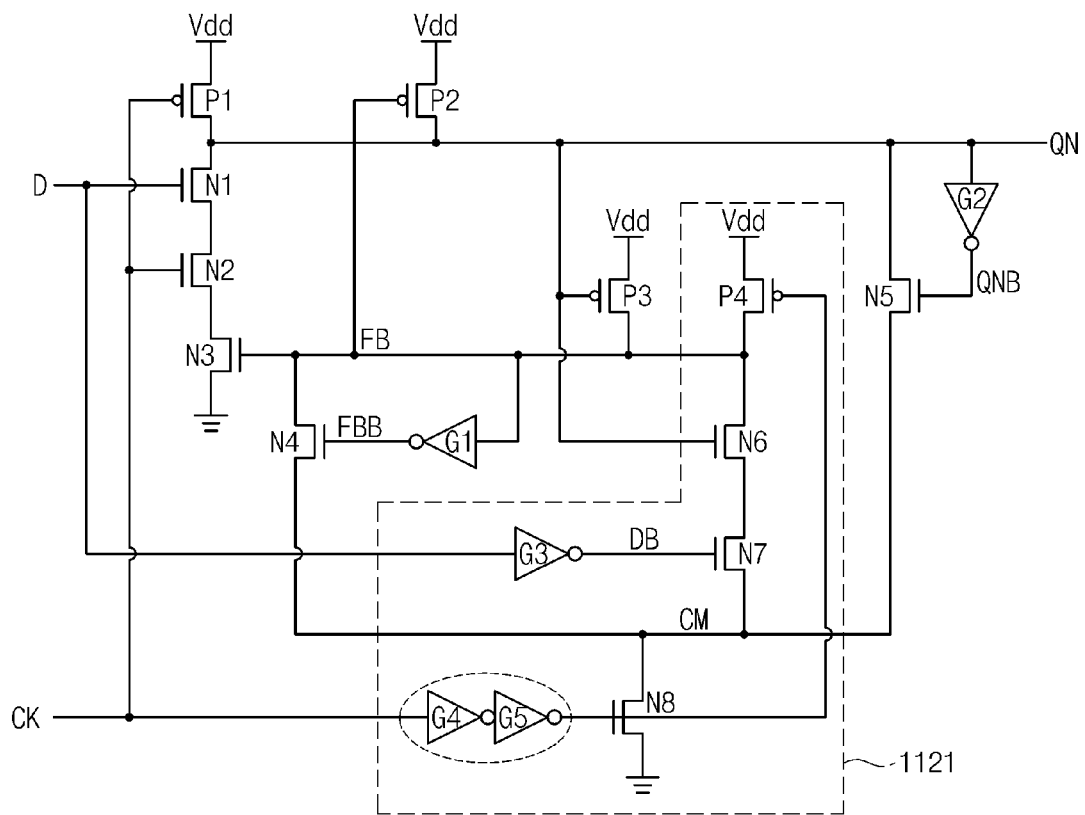
FIG. 12 is a circuit diagram illustrating a conditional delay part of a flop circuit illustrated in FIG. 3 according to an embodiment of the inventive concept.

FIG. 12 is a circuit diagram illustrating a flop circuit 1100A having a conditional delay part of a flop circuit of FIG. 3 according to an embodiment of the inventive concept.

Referring to FIG. 12, a conditional delay part 1121 of the flop circuit 1100A further include a delay chain G4 and G5, compared to a conditional delay part 1120 of a flop circuit 1100 of FIG. 3. By the delay chain G4 and G5, a turn-on point of time of an NMOS transistor N8 of the conditional delay part 1121 may be delayed, compared to a turn-on point of time of an NMOS transistor N8 of a conditional delay part 1120 in FIG. 3. A delay of the turn-on point of time of the NMOS transistor N8 makes it possible to increase a setup margin of the flop circuit 1100A.

A signal DB may need to maintain a logic high level at a transition point of time of a clock signal CK so that a discharge operation of a signal FB of the conditional delay part 1120 in FIG. 3 can be executed stably. If the signal DB becomes high after a transition point of time of the clock signal CK, the flop circuit 1100 of FIG. 3 may operate abnormally due to a setup violation (variation or margin).

The above-described problem can be prevented by adding the delay chain G4 and G5 in the conditional delay part 1121. A turn-on time of the NMOS transistor N8 is delayed by the delay chain G4 and G5, so that a sufficient setup time tSETUP may be secured.

Figure 13:
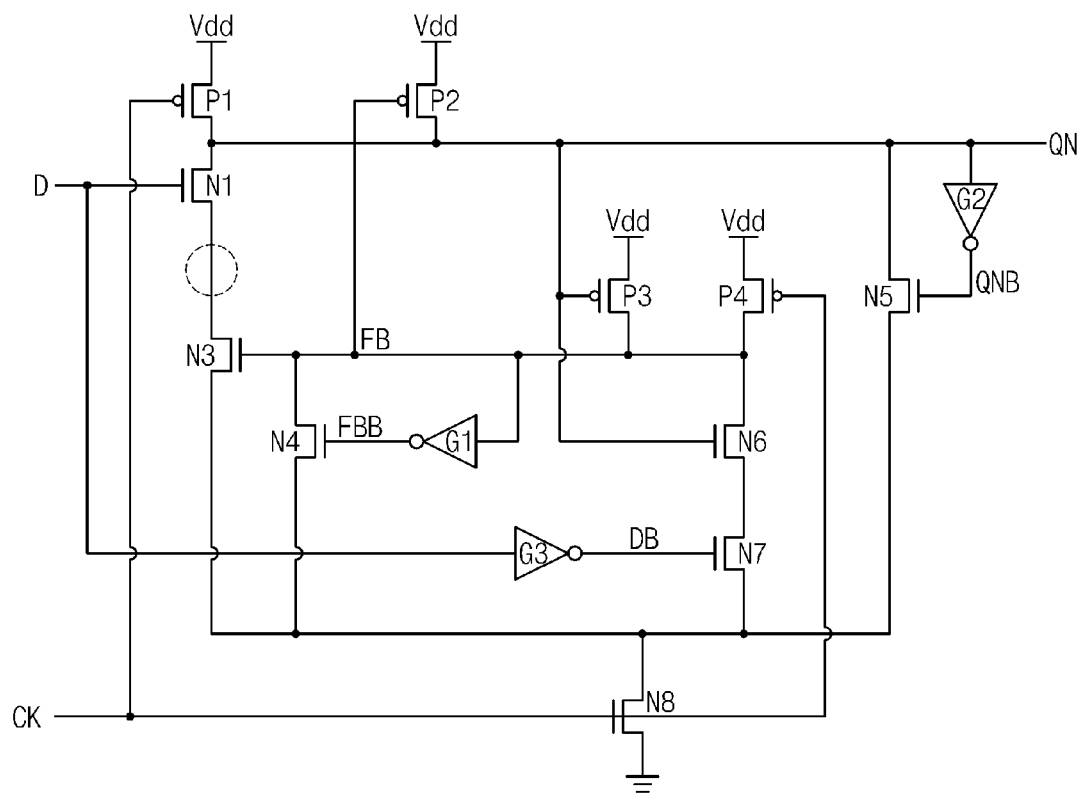
FIG. 13 is a circuit diagram illustrating an evaluation part and a conditional delay part of a flop circuit illustrated in FIG. 3 according to an embodiment of the inventive concept.

FIG. 13 is a circuit diagram illustrating a flop circuit 1100B having an evaluation part and a conditional delay part of a flop circuit of FIG. 3 according to an embodiment of the inventive concept.

Referring to FIG. 13, a flop circuit 1100B is configured such that an evaluation part and a conditional delay part are not divided but combined as a control part. That is, the flop circuit 1100B may be configured such that a discharge path of a signal QN and a discharge path of a signal FB share an NMOS transistor N8. The number of elements required to form the flop circuit 1100B of FIG. 13 may be reduced. For example, referring to FIGS. 3 and 13, the flop circuit 1100B of FIG. 13 is identical to that of FIG. 3 except that an NMOS transistor N2 of FIG. 2 is removed.

Figure 14:
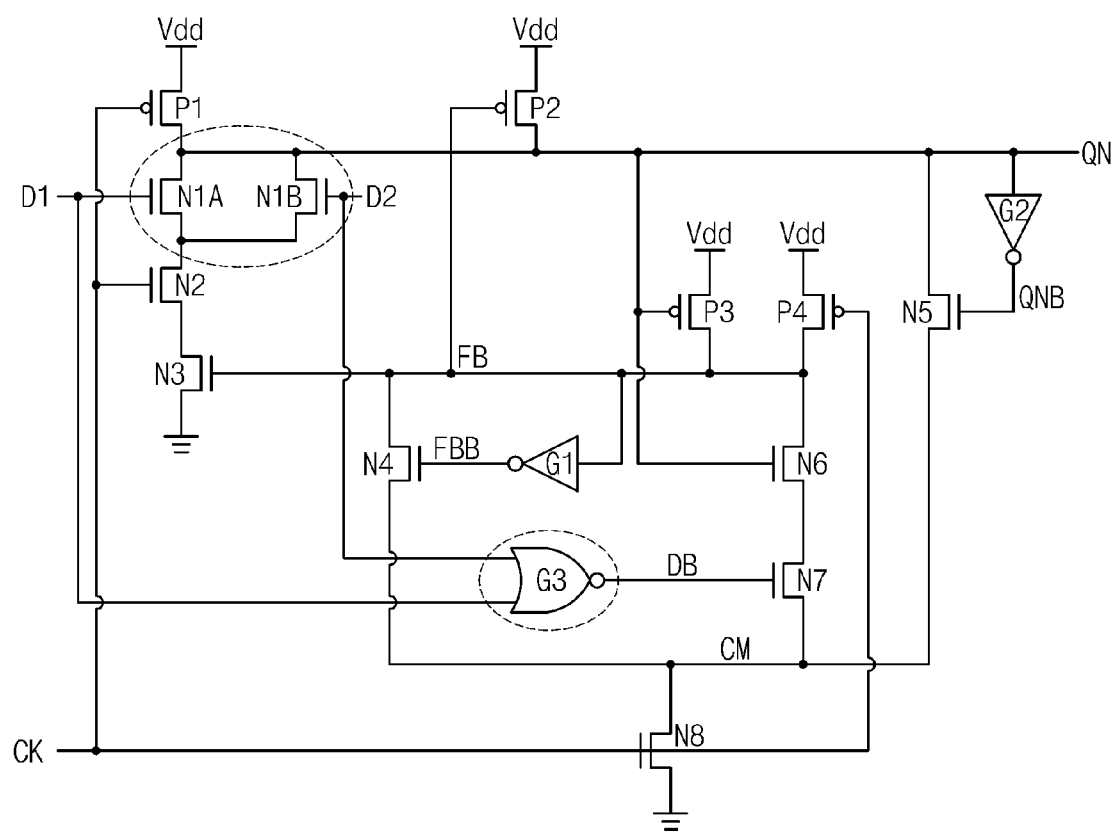
FIG. 14 is a circuit diagram illustrating a flop circuit receiving two input signals according to an embodiment of the inventive concept.

FIG. 14 is a circuit diagram illustrating a flop circuit 1100C to receive two input signals according to an embodiment of the inventive concept.

Referring to FIG. 14, the flop circuit 1100C receives two input signals D1 and D2. That is, the flop circuit 1100C performs an evaluation operation on a signal QN according to data of the input signals D1 and D2 at a rising edge of a clock signal CK.

The flop circuit 1100C of FIG. 14, for example, is configured to evaluate a signal QN according to an OR operation of input signals D1 and D2. That is, the flop circuit 1100C is configured such that NMOS transistors N1A and N1B receiving the input signals D1 and D2 are connected in parallel. Accordingly, when at least one of the input signals D1 and D2 has a high level, the signal QN is discharged. When the input signals D1 and D2 have a low level, a discharge path of the signal QN is interrupted.

In the flop circuit 1100C, an inverter G3 of a flop circuit 1100 of FIG. 3 is replaced with a NOR gate G3. Accordingly, the flop circuit 1100C of FIG. 14 operates to be similar to that of FIG. 3, and description thereof is thus omitted.

The flop circuit 1100C is exemplarily illustrated in FIG. 14, but the inventive concept is not limited thereto. For example, a flop circuit 1100 of FIG. 3 is configured to evaluate the signal QN according to an AND operation of the input signals D1 and D2. In this case, the NMOS transistors N1A and N1B receiving the input signals D1 and D2 are connected in series, and an NOR gate of FIG. 14 may be replaced with a NAND gate.

As described above, it is possible to variously change a flop circuit 1100 according to an exemplary embodiment of the inventive concept. Further, as illustrated in FIG. 2, the flop circuit 1100 is connected with a latch part 1200 to operate as a conventional flip-flop. Below, various embodiments of the latch part 1200 connected with the flop circuit 1100 will be more described with reference to FIGS. 15 to 19.

Figure 15:
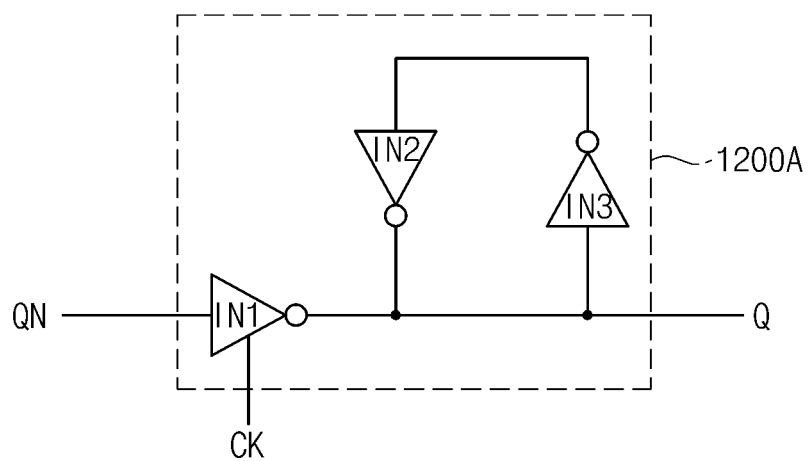
FIG. 15 is a block diagram illustrating a latch part illustrated in FIG. 2 according to an exemplary embodiment of the inventive concept.

FIG. 15 is a block diagram illustrating a latch part 1200A as the latch part 1200 of the flip flop 1000 of FIG. 2 according to an exemplary embodiment of the inventive concept.

Referring to FIG. 15, a latch part 1200A receives a signal QN from a flop circuit 1100 of the flip flop 1000 of FIG. 2 and a clock signal CK from an external unit. Herein, the clock signal CK is a signal synchronized with a clock signal provided to the flop circuit 1100. The latch part 1200A includes three inverters IN1, IN2, and IN3.

The inverter IN1 is a tri-state inverter and receives the signals QN and CK. During a logic high interval of the click signal CK, the inverter IN1 inverts the signal QN, and an inverted version of the signal QK is issued as an output signal Q.

Data of the signal QN inverted within the logic high interval of the clock signal CK is latched by the inverters IN2 and IN3. In a case where the clock signal CK has a logic low level, the inverters IN2 and IN3 outputs the latched signal QN as the output signal Q.

Figure 16:
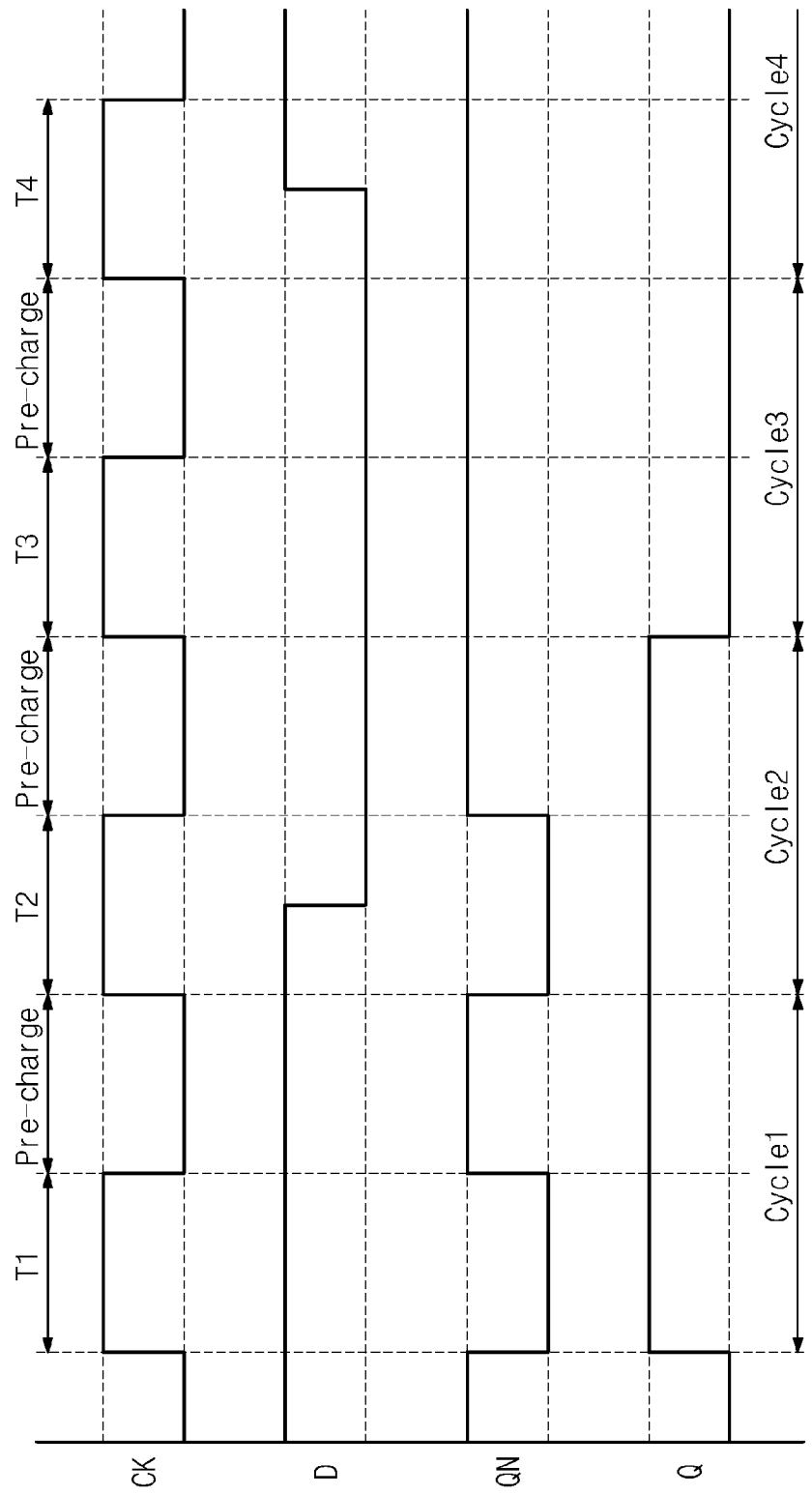
FIG. 16 is a timing diagram illustrating an operation of a latch part illustrated in FIG. 15.

FIG. 16 is a timing diagram illustrating an operation of a latch part 1200A of FIG. 15.

As illustrated in FIG. 16, at an interval T1 of the first cycle, a logic level of a signal QN is inverted by an inverter IN1 of a latch part 1200A. At a pre-charge interval of the first cycle, inverters IN2 and IN3 of the latch part 1200A maintain a logic level of the output signal Q determined at the interval T1. As a result, data of an input signal D corresponding to a rising edge of the clock signal CK is maintained for the first cycle. Operations of remaining cycles may be performed in the same manner as the first cycle, and description thereof is thus omitted.

Figure 17:
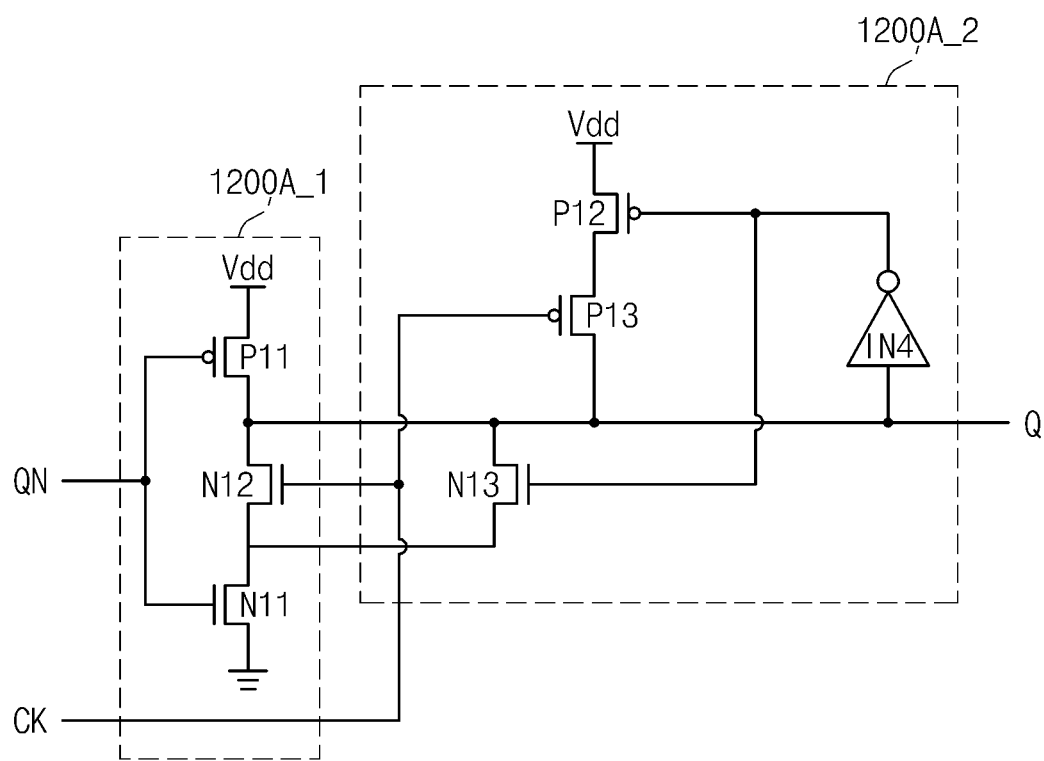
FIG. 17 is a circuit diagram illustrating a latch part illustrated in FIG. 15 according to an exemplary embodiment of the inventive concept.

FIG. 17 is a circuit diagram illustrating a latch part 1200A of FIG. 15 according to an exemplary embodiment of the inventive concept. Referring to FIGS. 16 and 17, the latch part 1200A includes an inverter part 1200A_1 to perform an operation of an inverter IN1 of FIG. 15 and an operation of inverters IN2 and IN3 of FIG. 15.

The inverter part 1200A_1 is formed of a PMOS transistor P11 and two NMOS transistors N11 and N12. The NMOS transistor N12 is turned on for a logic high interval of a clock signal CK. At this time, if a signal QN is at a logic high level, the PMOS transistor P11 is turned off and the NMOS transistor N11 is turned on. Accordingly, the output signal Q is discharged. This means that the output signal Q maintains a logic high level unlike the signal QN.

On the other hand, if the signal QN is at a logic low level for a logic high interval of the clock signal CK, the PMOS transistor P11 is turned on and the NMOS transistor N11 is turned off. Accordingly, the output signal Q is charged. This means that the output signal Q maintains a logic low level unlike the signal QN. As a result, the inverter part 1200A_1 inverts a logic level of the signal QN which is determined at a logic high level of the clock signal CK.

The latch part 1200A_2 includes two PMOS transistors P12 and P13, one NMOS transistor N13, and one inverter IN4.

In a case where the output signal Q has a logic high level at a logic high interval of the clock signal CK, the PMOS transistor P12 is turned on. If the clock signal CK transitions from a logic high level to a logic low level, the PMOS transistor P13 is turned on. Thus, the output signal Q is charged via the PMOS transistors P12 and P13.

In the event that the output signal Q has a logic low level at a logic high interval of the clock signal CK, the NMOS transistors N11 and N13 are turned on. Although the clock signal CK transitions from a logic high level to a logic low, the NMOS transistors N11 and N13 are continuously turned on.

As a result, the latch part 1200A_2 maintains data of the output signal Q, which is determined at a logic high interval of the clock signal CK, even at a logic low interval of the clock signal CK. Thus, a flop circuit 1100 illustrated in FIG. 2 may perform a general flip-flop operation together with the latch part 1200A_2.

Although FIGS. 15, 16, and 17 exemplary illustrate embodiments of a latch part, the inventive concept is not limited thereto. For example, a latch part 1200 of FIG. 2 may be configured to include a transmission gate and the like. Alternatively, the latch part 1200 of FIG. 2 can be configured to include a keeper formed of a PMOS transistor and an NMOS transistor. Alternatively, an operation of the latch part 1200 of FIG. 2 can be performed by a parasitic capacitance of a flop circuit 1100. It is possible that the latch part 1200 of FIG. 2 may be formed of an R-S latch. Below, a latch part 1200 using an R-S latch will be more fully described with reference to FIGS. 18 and 19.

Figure 18:
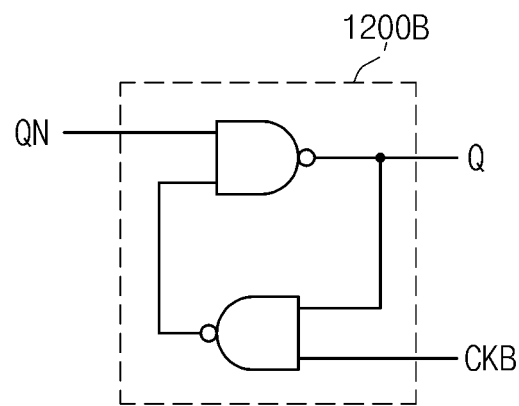
FIGS. 18 and 19 are diagrams illustrating a latch part illustrated in FIG. 2 according to other exemplary embodiments of the inventive concept.
Figure 19:
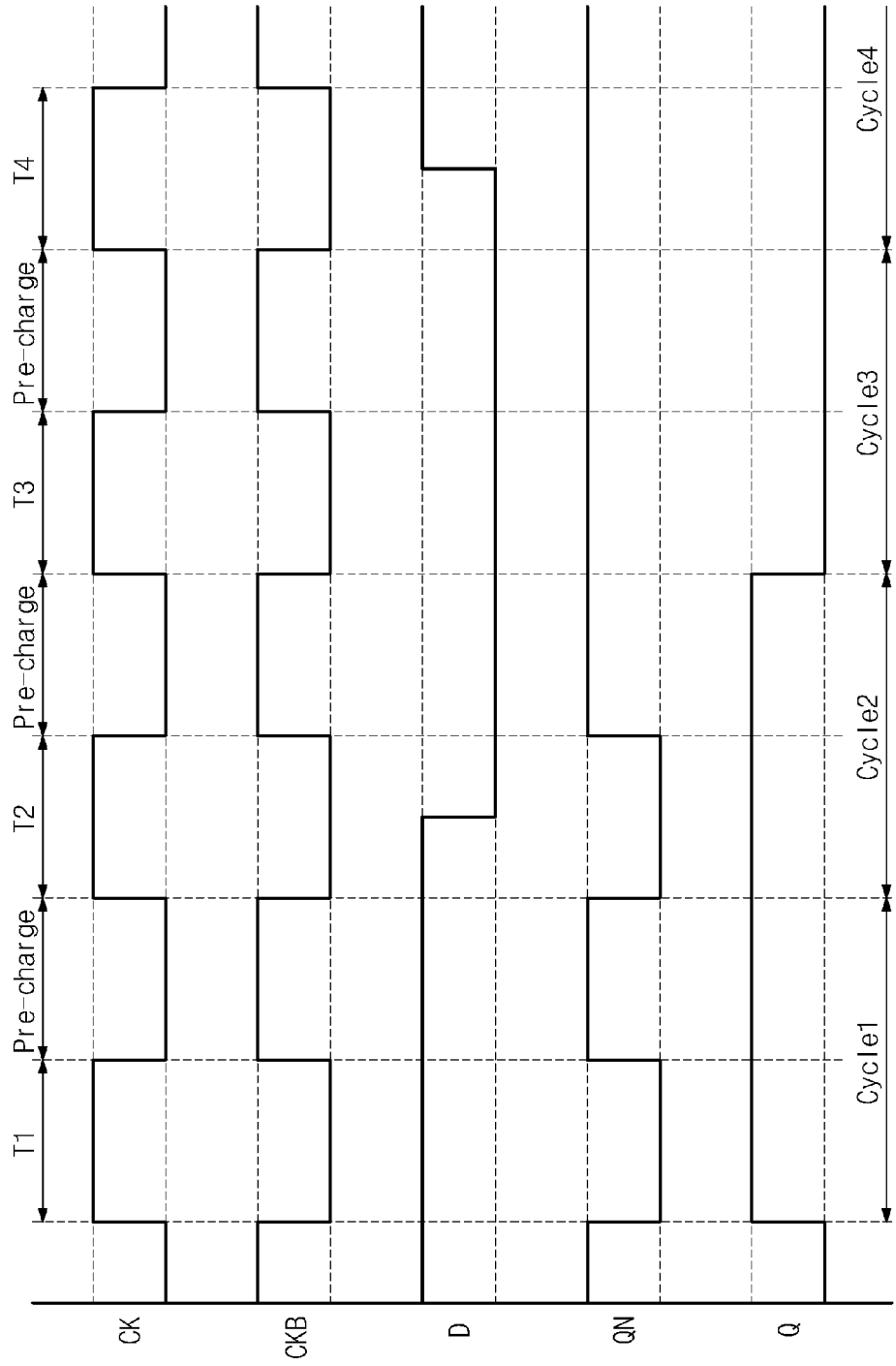

FIGS. 18 and 19 are diagrams illustrating a latch part 1200B as a latch part 1200 of the flip flop 1000 of FIG. 2 according to other exemplary embodiments of the inventive concept. In FIG. 18, there is illustrated an example that the latch part 1200 of FIG. 2 is implemented using an R-S latch.

In FIG. 19, there is illustrated a timing diagram illustrating an operation of the latch part 1200B of FIG. 18.

Referring to FIG. 18, the latch part 1200B may be formed of two NAND gates. The latch part 1200B issues an output signal Q in response to a signal QN and an inverted clock signal CKB. Input terminals each receiving the signals QN and CKB correspond to terminals R and S of the R-S latch, respectively. A terminal issuing an output signal of the latch part 1200B corresponds a terminal Q of the R-S latch.

As is well known in the art, an R-S latch holds output data of a Q terminal when data of terminals R and S all are '0'. In accordance with characteristics of the R-S latch, as illustrated in FIG. 19, the latch part 1200B holds a logic level of the output signal Q at a pre-charge interval in which the signals CKB and QN have a logic high level.

As described above, the flop circuit 1100 may perform a general flip-flop operation together with a latch part 1200. In this case, the latch part 1200 may be formed to be various as described in FIGS. 15 to 19.

However, the inventive concept is not limited. That is, the flop circuit 1100 may be connected to the latch part 1200 to perform a general flip-flop operation. Alternatively, the flop circuit 1100 can be applied to a different type flip-flop (e.g., a gated flip-flop). A gated flip flop with a flop circuit will be described in FIGS. 20-23 as an example of a flip flop circuit according to an exemplary embodiment of the inventive concept.

Figure 20:
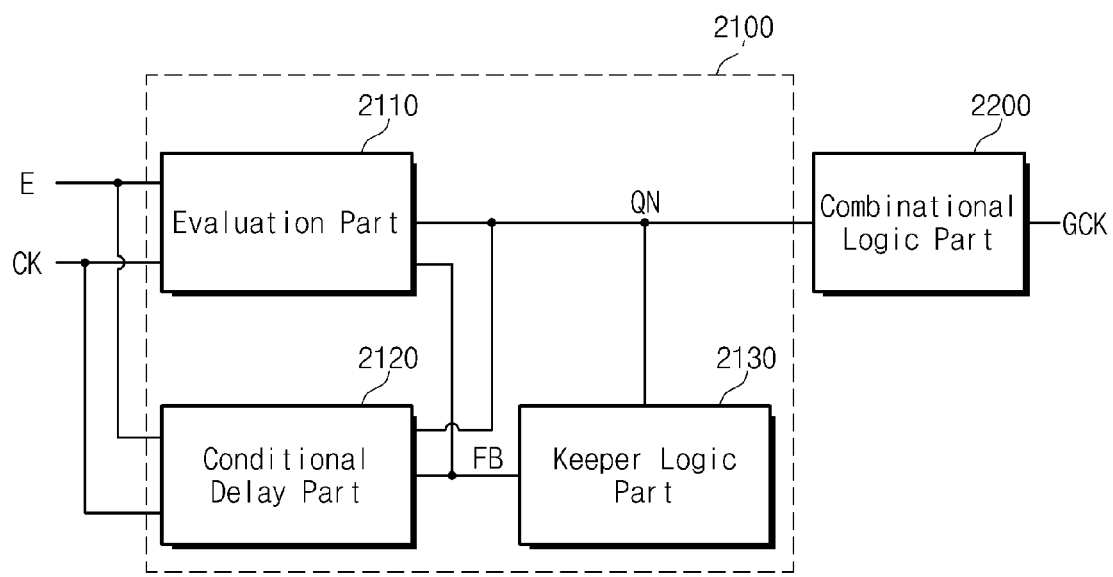
FIG. 20 is a block diagram illustrating a gated flip-flop according to an exemplary embodiment of the inventive concept.

FIG. 20 is a block diagram illustrating a gated flip-flop 2000 according to an exemplary embodiment of the inventive concept. The gated flip-flop 2000 of FIG. 20 may be implemented using a flop circuit illustrated in FIGS. 2 to 14.

The gated flip-flop 2000 is configured to output a clock signal CK only within an active interval of an enable signal E. Referring to FIG. 20, the gated flip-flop 2000 includes a flop circuit 2100 and a combinational logic part 2200.

The flop circuit 2100 includes an evaluation part 2110, a conditional delay part 2120, and a keeper logic part 2130. The evaluation part 2110 is identical to that in FIG. 2 except that an input signal D (refer to FIG. 2) is replaced with an enable signal E. Further, the conditional delay part 2120 and the keeper logic part 2130 are identical to those in FIG. 2. Various embodiments of the flop circuit 1100 of FIG. 2 described in FIGS. 9 to 14 may be applied to the flop circuit in FIG. 20.

The combinational logic part 2200 outputs a gated clock signal GCK in response to a signal QN. The combinational logic part 2200 may be implemented using various logic gates.

Figure 21:
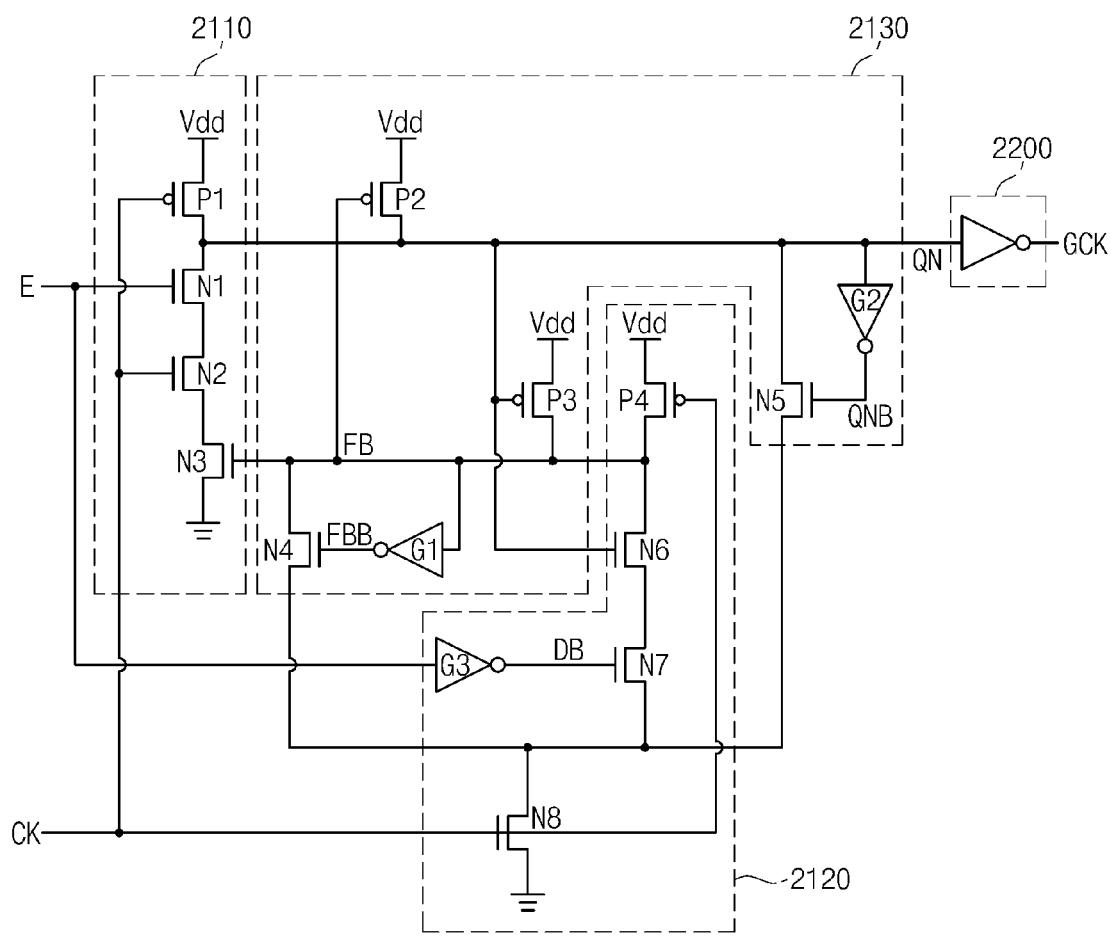
FIG. 21 is a circuit diagram illustrating a gated flip-flop illustrated in FIG. 20 according to an exemplary embodiment of the inventive concept.

FIG. 21 is a circuit diagram illustrating the gated flip-flop 2000 of FIG. 20 according to an exemplary embodiment of the inventive concept. For the sake of description, it is assumed that an evaluation part 2110, a conditional delay part 2120, and a keeper logic part 2130 are identical to those in FIG. 3. Further, it is assumed that a combinational logic part 2200 is implemented using logic gates and an inverter.

Figure 22:
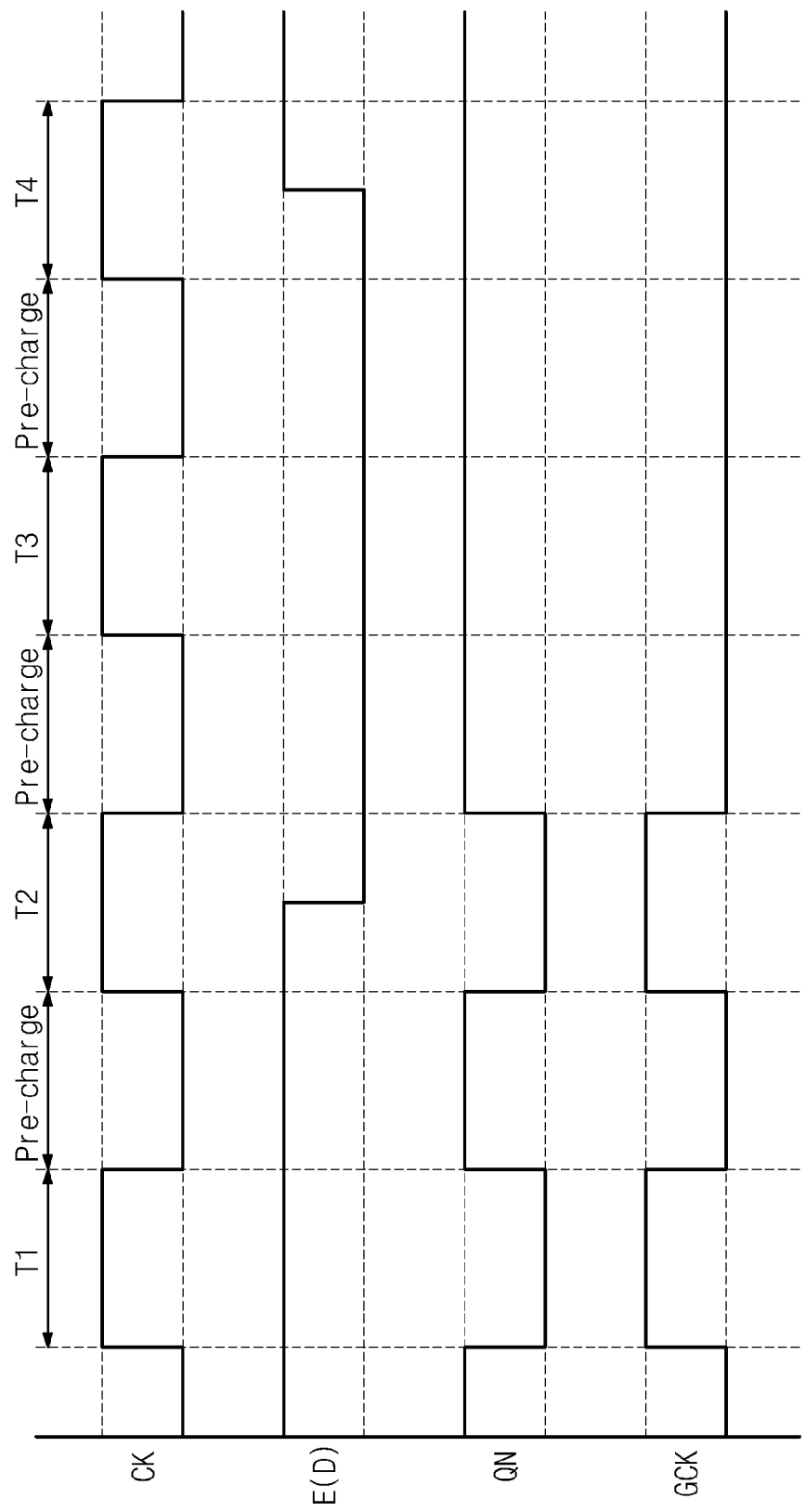
FIG. 22 is a timing diagram illustrating an operation of a gated flip-flop illustrated in FIG. 20.

FIG. 22 is a timing diagram illustrating an operation of the gated flip-flop 2000 of FIG. 20.

Referring to FIGS. 21 and 22, an evaluation part 2110 evaluates a signal QN in response to an enable signal E and a clock signal CK. A conditional delay part 2120 discharges a signal FB to have a logic level different from that of the signal QN. During a logic high interval of the clock signal CK, a keeper logic part 2130 maintains a logic level of the signal QN in response to signals QN and FB having different logic levels from each other. This may be performed in a similar way to that described in FIGS. 3 to 8, and description thereof is thus omitted.

The combinational logic part 2200 is configured to invert the signal QN. That is, a gated clock signal GCK is a signal obtained by inverting the signal QN. Thus, as illustrated in FIG. 22, the combination logic part 2200 outputs the gated clock signal GCK synchronized with the clock signal CK within a logic high interval of the enable signal E. The combination logic part 2200 outputs the gated clock signal GCK having a logic low level at a logic low interval of the enable signal E. As a result, a flop circuit 2100 according to an exemplary embodiment of the inventive concept can perform an operation of a gated flip-flop together with the combinational logic part 2200.

A flop circuit according to an exemplary embodiment of the inventive concept may be applied to a gated flip-flop which supports a scan test operation. This will be more fully described with reference to FIG. 23.

Figure 23:
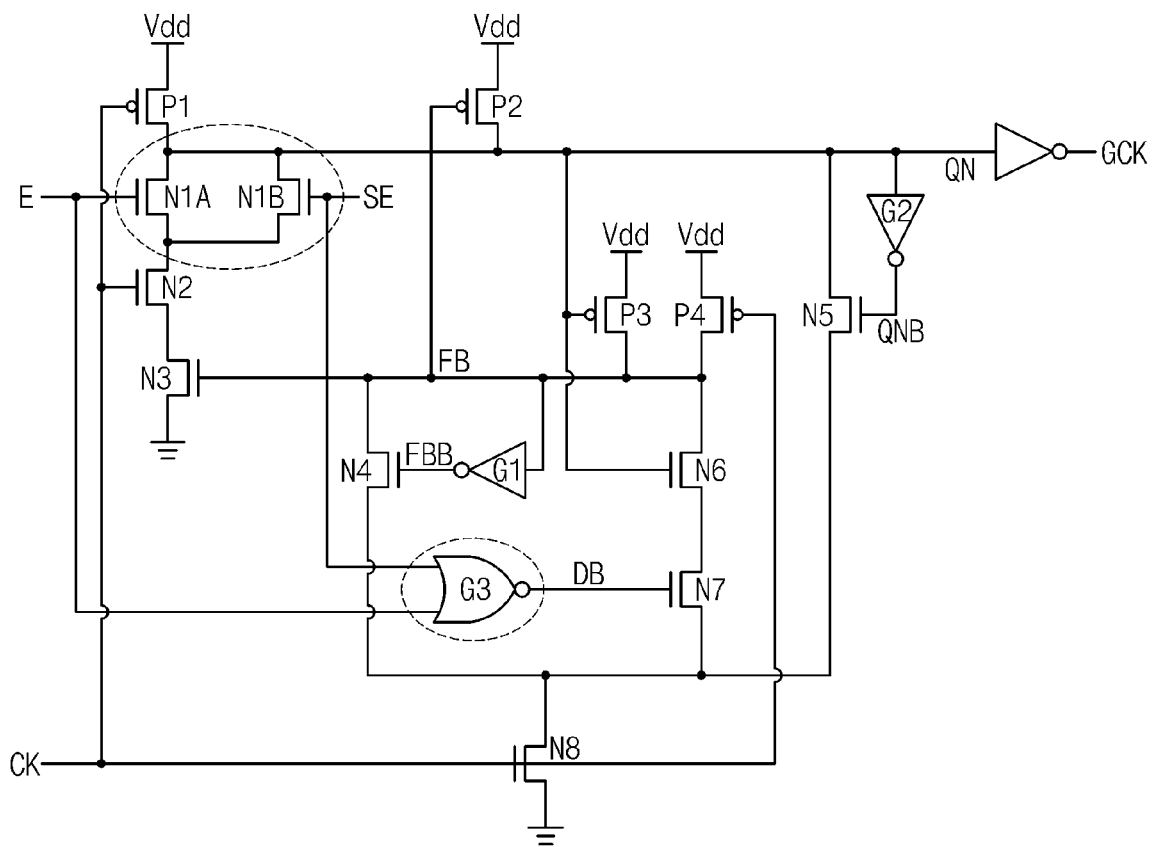
FIG. 23 is a circuit diagram illustrating a gated flip-flop according to an exemplary embodiment of the inventive concept.

FIG. 23 is a circuit diagram illustrating a gated flip-flop 3000 according to an exemplary embodiment of the inventive concept. The gated flip-flop 3000 of FIG. 23 includes a flop circuit 1100C in FIG. 14 to support a scan test operation.

Referring to FIG. 23, the gated flip-flop 3000 operates an enable signal E, a scan enable signal SE, and a clock signal CK. Herein, the scan enable signal SE is used for a scan test operation.

If the scan enable signal SE becomes high, the gated flip-flop 3000 outputs the gated clock signal GCK synchronized with the clock signal CK regardless of a logic level of the enable signal E. If the scan enable signal SE is at a logic low level, the gated flip-flop 3000 operates in the same manner as the gated flip-flop 2000 of FIG. 21. The gated flip-flop 3000 is substantially identical to that 1100C of FIG. 14, and description thereof is thus omitted.

Figure 24:
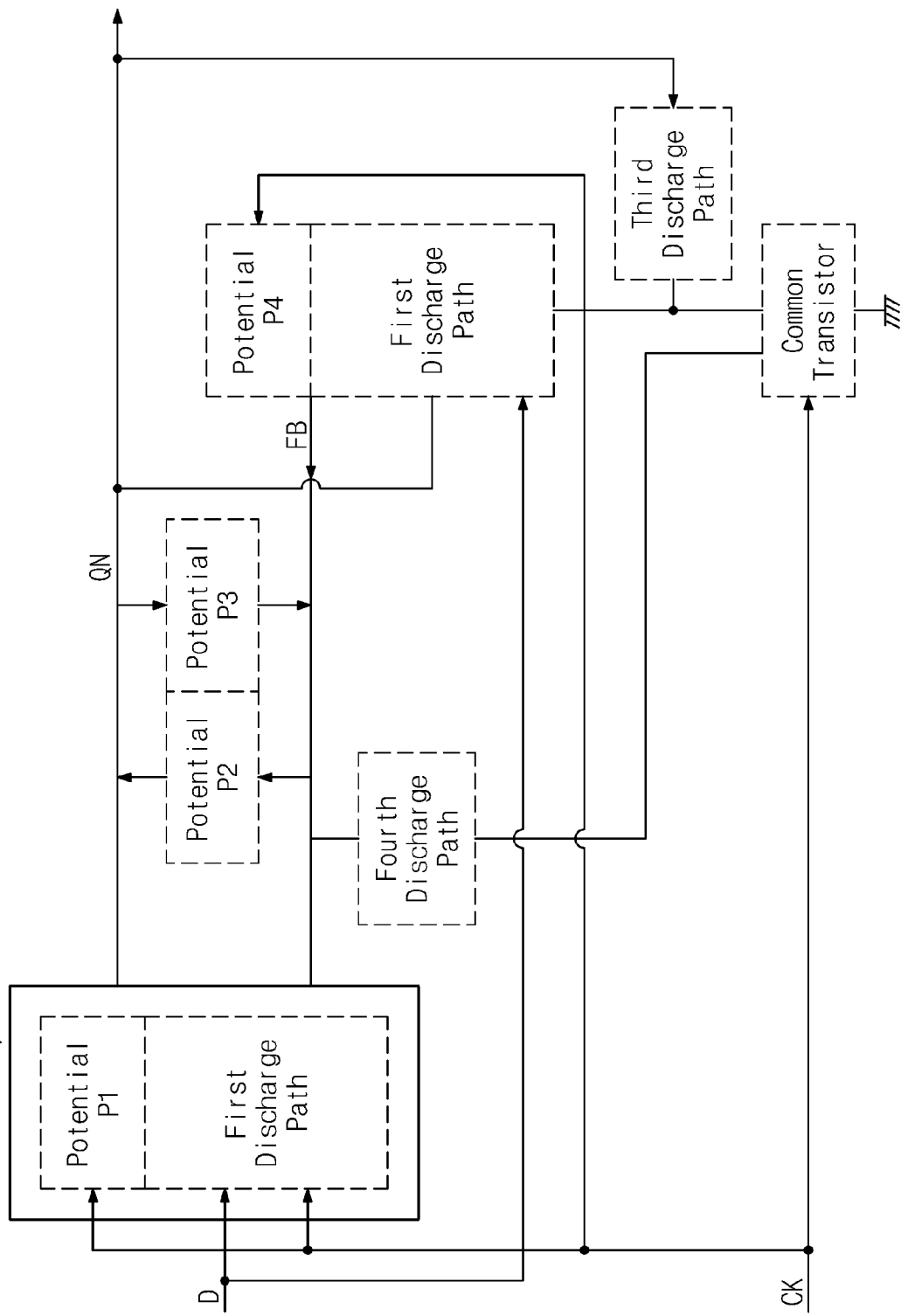
FIG. 24 is a block diagram illustrating a flip-flop according to an exemplary embodiment of the present general inventive concept.

Referring to FIG. 24, a flip-flop circuit may include an evaluation part 2410 and a control part 2420. The evaluation part 2410 may be similar to the evaluation part of FIG. 3, 21 or 23. The control part 2420 may be similar to the conditional delay part and the keeper logic part of FIG. 3, 21, or 23. The evaluation part 2410 may include a potential having a voltage Vdd and a PMOS transistor, and a first discharge path formed with NMOS transistors, for example, N1, N2, and N3 of FIG. 3, for example.

The control part 2420 may include potentials formed with PMOS transistors P2 and P3 and a voltage Vdd and a second discharge path formed with NMOS transistors, N6 and N7, for example. The second discharge path may further include an inverter G3 and may be used as paths to discharge a first output signal QN and/or a second output signal FB. The control part 2420 may further include a third discharge path formed with an inverter G2 and an NMOS transistor N5, a fourth discharge path formed with an inverter G1 and an NMOS transistor N4, and a common transistor formed with an NMOS transistor N8, for example. Here, the common transistor may be activated at a logic high level of a clock signal to operate the second, third, and fourth discharge paths. It is possible that the common transistor may be included in each of the second, third, and fourth discharge paths. It is also possible that the second, third, and fourth discharge paths may be referred to as a discharge path to perform operations of the second, third and fourth discharge paths.

A flip-flop circuit according to an exemplary embodiment of the inventive concept operates in a high speed as compared with conventional flip-flop circuits. Further, the flip-flop circuit according to an exemplary embodiment of the inventive concept has a narrow sampling window and is suitable for designing a sequential circuit of a small area or dimension.

The above-disclosed subject matter is to be considered illustrative, and not restrictive, and the appended claims are intended to cover all such modifications, enhancements, and other embodiments, which fall within the true spirit and scope. Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A flip-flop circuit comprising:
an evaluation part connected to a first node and a second node to discharge the second node according to a voltage level of the first node, the evaluation part comprising at least two transistors;
a conditional delay part connected to the second node to discharge a third node to have a voltage level different from a voltage level of the second node and connected to the first node directly to discharge the third node based on signals from the first and second nodes, the conditional delay part comprising at least two transistors configured to have a stack form; and
a keeper logic part connected to the second node and third node to maintain a voltage level of one of the second and third nodes being not discharged,
wherein a first discharge path from the second node to a constant ground node is completely separated from a second discharge path from the third node to the constant ground node such that the first and second discharge paths do not share any common path,
the evaluation part is triggered according to an edge of a clock signal to perform an evaluation operation,
the keeper logic part maintains a logic level of the output signal during half a cycle of the clock signal after the evaluation operation, and
a size of each of the at least two transistors included in the conditional delay part is smaller than that of the at least two transistors included in the evaluation part.

2. The flip-flop circuit of claim 1, wherein:
the evaluation part comprises a first transistor to form a current path between the second node and a ground voltage according to a voltage level of the first node;
the conditional delay part comprises a second transistor to form a current path between the third node and the ground voltage according to a voltage level of the second node received at a gate of the second transistor; and
wherein if the second node is discharged when the first transistor is turned on, the second transistor is turned off and the second discharge path of the third node is interrupted.

3. The flip-flop circuit of claim 2, wherein:
the keeper logic part comprises a third transistor to form a current path between a power supply voltage and the third node according to a voltage level of the second node; and
wherein if the second node is discharged, the third transistor is turned on to be charged with the power supply voltage.

4. The flip-flop circuit of claim 3 wherein:
the keeper logic part further comprises a fourth transistor to form a current path between the second node and a ground voltage according to a voltage level of the second node received at a gate of the fourth transistor; and
when the second node is discharged, the fourth transistor is turned on to maintain a discharge state of the second node.

5. The flip-flop circuit of claim 2, wherein if the second node is discharged, a voltage level of the first node is maintained until a discharge operation of the second node is completed.

6. The flip-flop circuit of claim 1, wherein the evaluation part comprises a first transistor and a second transistor connected in series with each other to form the first discharge path on the second node in response to the clock signal and a voltage level of the first node, respectively.

7. The flip-flop circuit of claim 6, wherein the evaluation part further comprises a third transistor to be connected to the second transistor to form the first discharge path on the second node according to a voltage level of the third node.

8. The flip-flop circuit of claim 7, wherein the evaluation part further comprises a fourth transistor to be connected between a power supply voltage and the first transistor to form a charge path on the second node according to the clock signal.

9. The flip-flop circuit of claim 1, wherein the conditional delay part comprises a first transistor and a second transistor connected in series with each other to form the second discharge path on the third node according to a voltage of the second node and a voltage of the first node, respectively.

10. The flip-flop circuit of claim 9, wherein the conditional delay part further comprises a third transistor to be connected to the second transistor to form the second discharge path on the third node in response to the clock signal.

11. The flip-flop circuit of claim 10, wherein the conditional delay part further comprises a fourth transistor to be connected between a power supply voltage and the first transistor to form a path for charging the third node with the power supply voltage.

12. The flip-flop circuit of claim 1, wherein the keeper logic part comprises:
a first transistor connected to the second node to form a current path between the second node and a ground voltage according to a voltage level of the second node received at a gate of the first transistor; and
a second transistor connected to the second node to form a current path between the second node and a power supply voltage according to a voltage level of the third node;
a third transistor to be connected to the third node to form a current path between the third node and a ground voltage according to a voltage level of the third node; and,
a fourth transistor which is connected to the third node and forms a current path between the third node and a power supply voltage according to a voltage level of the second node.

13. The flip-flop circuit of claim 1, further comprising:
a latch part to maintain voltage levels of the second and third nodes, determined at a logic high interval of the clock signal, during a logic low interval of the clock signal; and wherein
the evaluation part and the conditional delay part receive the clock signal, respectively and are triggered at a rising edge of the clock signal to discharge one of the second node and the third node; and
the keeper logic part maintains a voltage level of one being not discharged of the second and third nodes at a logic high interval of the clock signal.

14. A flip-flop circuit comprising:
an evaluation part connected to an input node and an output node to perform an evaluation operation to change or maintain a logic level of an output signal output via the output node according to a logic level of an input signal provided via the input node, the evaluation part comprising at least two transistors;
a conditional delay part connected to the input node directly and connected to the output node and a feedback node to change or maintain a logic level of a feedback signal output via the feedback node to have a logic level different from a logic level of the output signal node according to a logic level of the input signal and the output signal, the conditional delay part comprising at least two transistors configured to have a stack form; and
a keeper logic part connected to the feedback node and the output node to maintain a logic level of the output signal after the evaluation operation,
wherein a first discharge path from the output node to a constant ground node is completely separated from a second discharge path from the feedback node to the constant ground node such that the first and second discharge paths do not share any common path,
the evaluation part is triggered according to an edge of a clock signal to perform the evaluation operation,
the keeper logic part maintains a logic level of the output signal during half a cycle of the clock signal after the evaluation operation, and
a size of each of the at least two transistors included in the conditional delay part is smaller than that of the at least two transistors included in the evaluation part.

15. The flip-flop circuit of claim 14, further comprising:
a latch part connected to the output node,
wherein the latch part maintains a logic level of the output signal during a cycle of the clock signal after the evaluation operation.

16. The flip-flop circuit of claim 14, further comprising:
a combinational logic part connected to the output node,
wherein the combinational logic part comprises an inverter inverting a logic level of the output signal after the evaluation operation.

17. A flip-flop circuit comprising:
an evaluation part having a first potential and a first discharge path, connected to two input nodes and a first output node, to receive two signals via the two input nodes, and to output a first output signal via the first output node according to the potential and the first discharge path which are selected by the two signals, the evaluation part comprising at least two transistors and one of the two signals being a clock signal;
a conditional delay part, connected to the two input nodes directly and the first output node and a second output node, having a second potential and a second discharge path, to receive the two signals via the two input nodes, and to generate a second output via the second output node according to the second potential and the second discharge path, which are determined by the first output and the two signals, the conditional delay part comprising at least two transistors configured to have a stack form; and
a keeper logic part to maintain levels of the first output signal and the second output signal during a transition of at least one of the two signals according to a combination of the two signals, the first output, and the second output,
wherein the first discharge path of the first output node to a constant ground node is completely separated from the second discharge path of the second output node to the constant ground node such that the first and second discharge paths do not share any common path,
the evaluation part is triggered according to an edge of the clock signal to perform the evaluation operation,
the keeper logic part maintains a logic level of the output signal during half a cycle of the clock signal after the evaluation operation, and
a size of each of the at least two transistors included in the conditional delay part is smaller than that of the at least two transistors included in the evaluation part.

18. The flip-flop circuit of claim 17, wherein:
the first discharge path is formed with a plurality of first transistors to have a first characteristic; and
the second discharge path is formed with a plurality of second transistors to have a second characteristic different from the first characteristic such that a first discharge speed of the first discharge path is faster than a second discharge speed of the second discharge path.

* * * * *